US012640202B2

(12) United States Patent
Xu et al.

(10) Patent No.: US 12,640,202 B2
(45) Date of Patent: *May 26, 2026

(54) METHOD USED IN FORMING MEMORY CIRCUITRY COMPRISING STAIRS IN A STAIR-STEP REGION USING FIRST AND SECOND LAYERS OF IMAGEABLE RESIST

(71) Applicant: Micron Technology, Inc., Boise, ID (US)

(72) Inventors: Lifang Xu, Boise, ID (US); Anna Maria Conti, Milan (IT); Harsh Narendrakumar Jain, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 767 days.

This patent is subject to a terminal disclaimer.

(21) Appl. No.: 17/868,118

(22) Filed: Jul. 19, 2022

(65) Prior Publication Data

US 2024/0029794 A1      Jan. 25, 2024

(51) Int. Cl.
G11C 16/04 (2006.01)
H10B 41/10 (2023.01)
(Continued)

(52) U.S. Cl.
CPC ......... G11C 16/0483 (2013.01); H10B 41/10 (2023.02); H10B 41/27 (2023.02);
(Continued)

(58) Field of Classification Search
CPC ........ H10B 41/27; H10B 41/35; H10B 43/27; H10B 43/35; H10B 43/50
See application file for complete search history.

(56) References Cited

U.S. PATENT DOCUMENTS

2017/0263556 A1      9/2017   Tessariol et al.
2020/0286912 A1*     9/2020   Nanami ................. H10B 43/27
(Continued)

OTHER PUBLICATIONS

Conti et al., U.S. Appl. No. 17/868,232, filed Jul. 19, 2022, titled "Memory Circuitry and Method Used In Forming Memory Circuitry", 81 pages.

*Primary Examiner* — Davienne N Monbleau
*Assistant Examiner* — Heim Kirin Grewal
(74) *Attorney, Agent, or Firm* — Wells St. John P.S.

(57) ABSTRACT

A method used in forming memory circuitry comprises forming a stack comprising vertically-alternating first tiers and second tiers. The stack extends from a memory-array region into a stair-step region. The first tiers are conductive and the second tiers are insulative at least in a finished-circuitry construction. A first layer of imageable resist is exposed to actinic radiation and developed to form a first opening there-through in the stair-step region. The developed first layer is used in a plurality of alternating etching and lateral-trimming steps that widens the first opening and forms two opposing flights of stairs in the stack in the stair-step region. A second layer of imageable resist is formed directly above the two opposing flights of stairs. The second layer is exposed to actinic radiation and developed to form a second opening there-through. The second opening exposes all of the stairs of one of the two opposing flights. The second layer is directly above all of the stairs in the other of the two opposing flights. The developed second layer is used in a plurality of alternating etching and lateral-trimming steps that widens the second opening, lengthens at least one of the two opposing flights of stairs, and extends the two opposing flights of stairs deeper into the stack. Other embodiments, including structure, are disclosed.

9 Claims, 45 Drawing Sheets

(51) Int. Cl.

| | | |
|---|---|---|
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.

CPC ............. *H10B 41/35* (2023.02); *H10B 43/10* (2023.02); *H10B 43/27* (2023.02); *H10B 43/35* (2023.02)

(56) References Cited

U.S. PATENT DOCUMENTS

| | | | |
|---|---|---|---|
| 2021/0028104 A1* | 1/2021 | Lee | H10B 43/10 |
| 2022/0066313 A1* | 3/2022 | Lee | G03F 7/70441 |

* cited by examiner

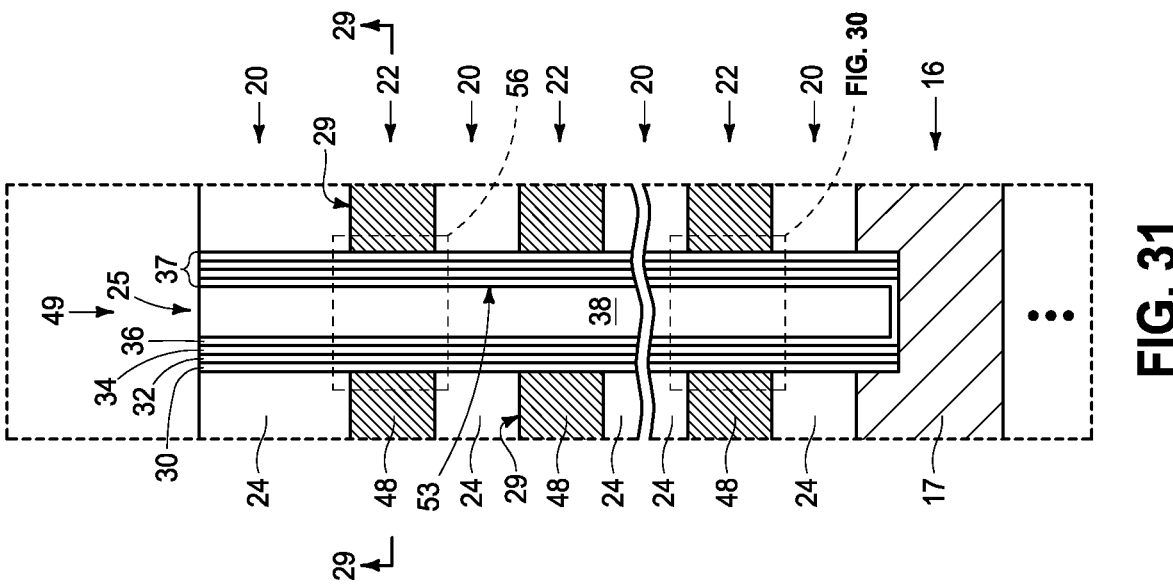
FIG. 31
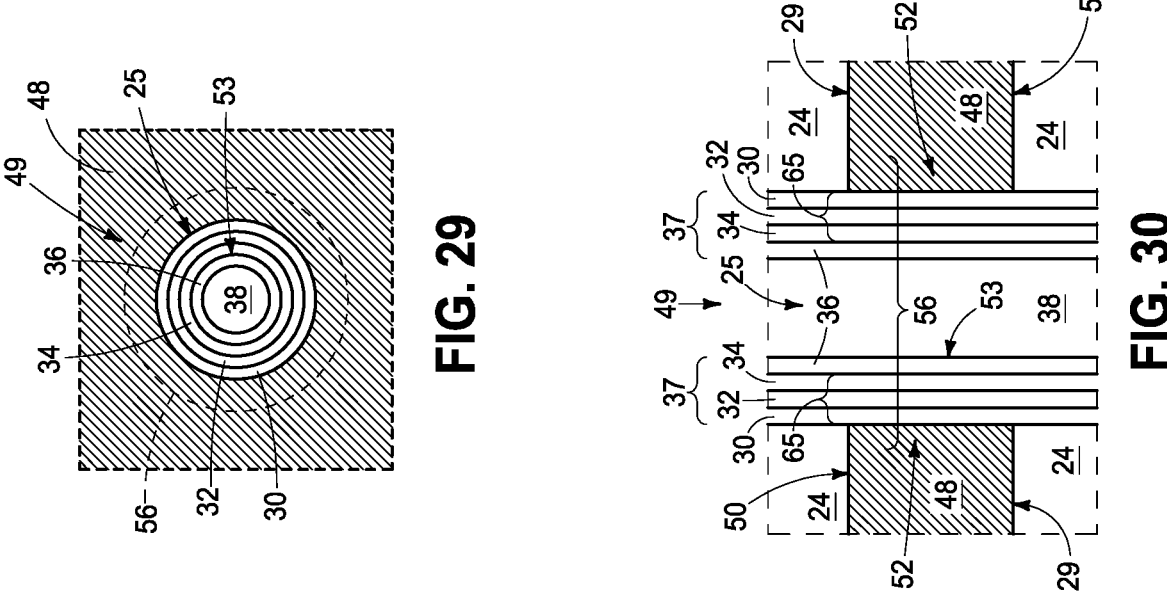
FIG. 29
FIG. 30

METHOD USED IN FORMING MEMORY CIRCUITRY COMPRISING STAIRS IN A STAIR-STEP REGION USING FIRST AND SECOND LAYERS OF IMAGEABLE RESIST

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 3 is a diagrammatic cross-sectional view taken through line 3-3 in FIG. 1.

FIGS. 2 and 4-51 are diagrammatic sectional, expanded, enlarged, and/or partial views of the construction of FIGS. 1-3 or portions thereof, and/or of alternate embodiments.

DETAILED DESCRIPTION OF EXAMPLE EMBODIMENTS

Embodiments of the invention encompass methods used in forming memory circuitry comprising a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. Some example embodiments are described with reference to FIGS. 1-51.

Figure 5:
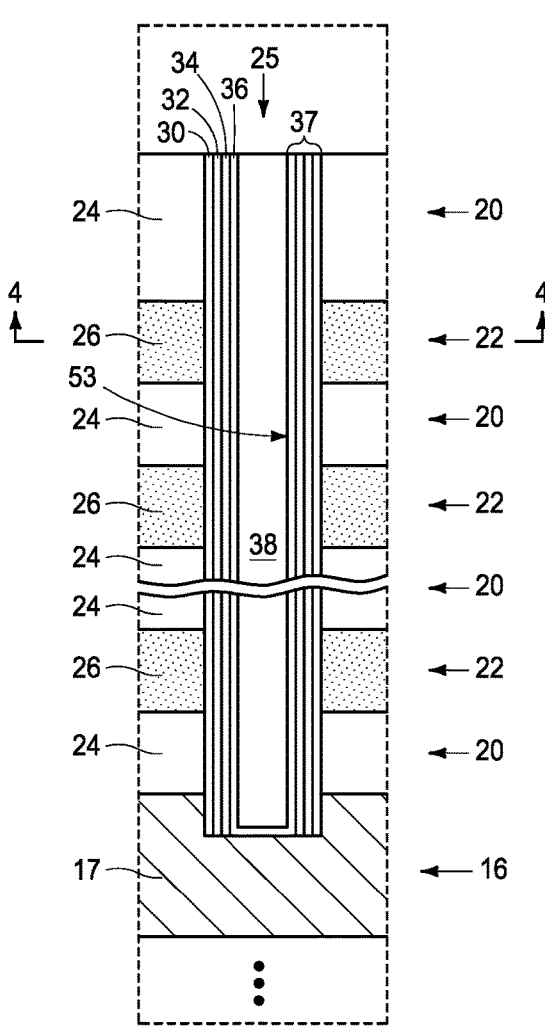
Figure 6:
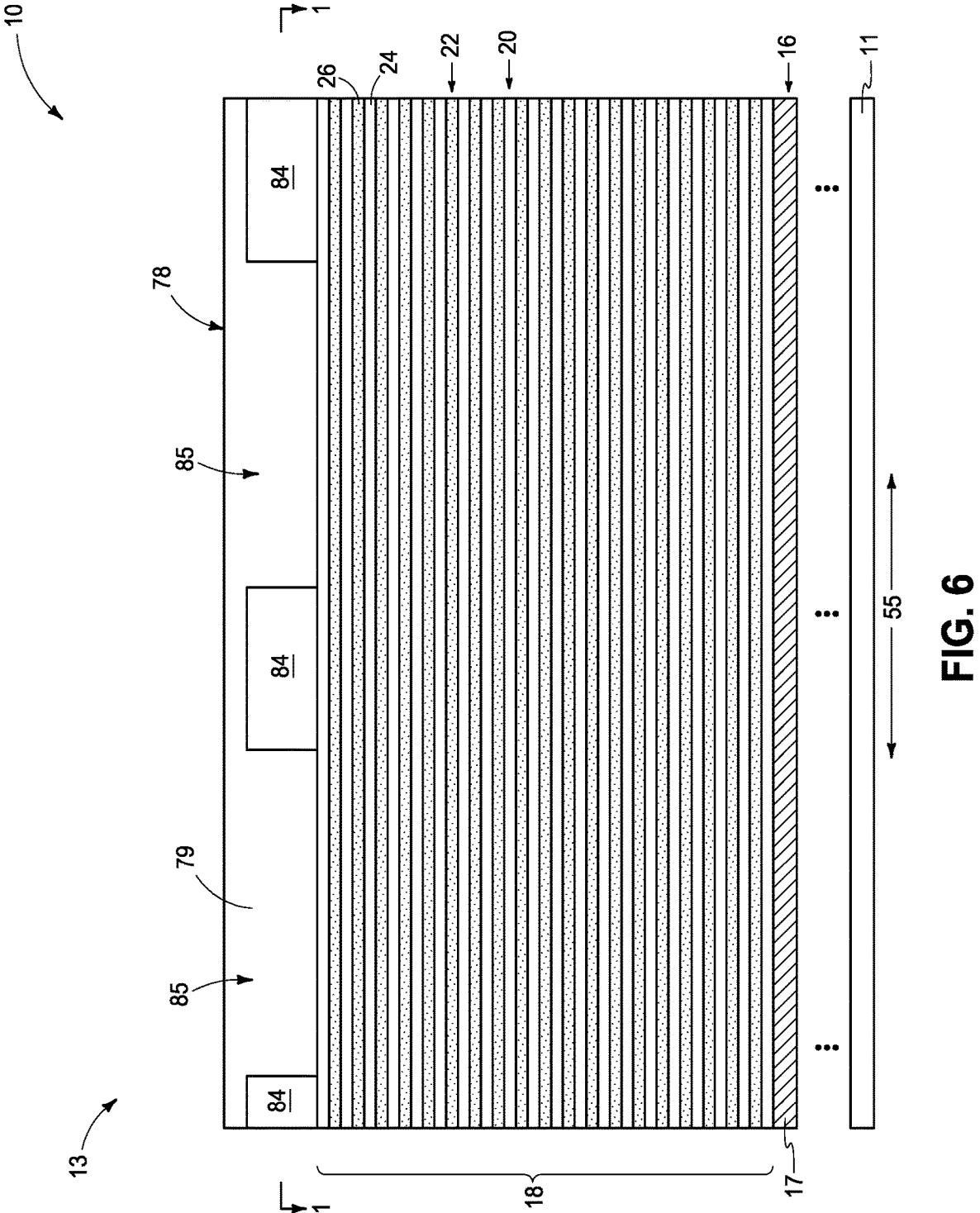

FIGS. 1-6 show an example construction 10 having two memory-array regions 12 in which elevationally-extending strings of transistors and/or memory cells will be formed. The two memory-array regions 12 may be of the same or different constructions relative one another. In one embodiment, a stair-step region 13 is between memory-array regions 12 and comprises stair-step structures as described below. Alternately, by way of example, a stair-step region may be at the end of a single memory-array region (not shown). FIG. 6 is of different scale compared to FIGS. 1-5 for clarity in disclosure more pertinent to stair-step region 13 than to memory-array regions 12. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-6-depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., WSi$_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16. In some embodiments, conductive tiers 22 may be referred to as first tiers 22 and insulative tiers 20 may be referred to as second tiers 20, with first tiers 22 being conductive and second tiers 20 being insulative at least in a finished-circuitry construction. Example thickness for each of tiers 20 and 22 is 20 to 60 nanometers. The example uppermost tier 20 may be thicker/thickest compared to one or more other tiers 20 and/or 22. Example first tiers 22 comprise material 26 (e.g., silicon nitride) and example second tiers 20 comprise material 24 (e.g., silicon dioxide). Only a small number of tiers 20 and 22 is shown in FIGS. 2-6 and other figures, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier.

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a first direction 55, with a second direction 99 being orthogonal thereto. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space (s) (not shown) and/or be devoid of solid material (not shown).

Figure 1:
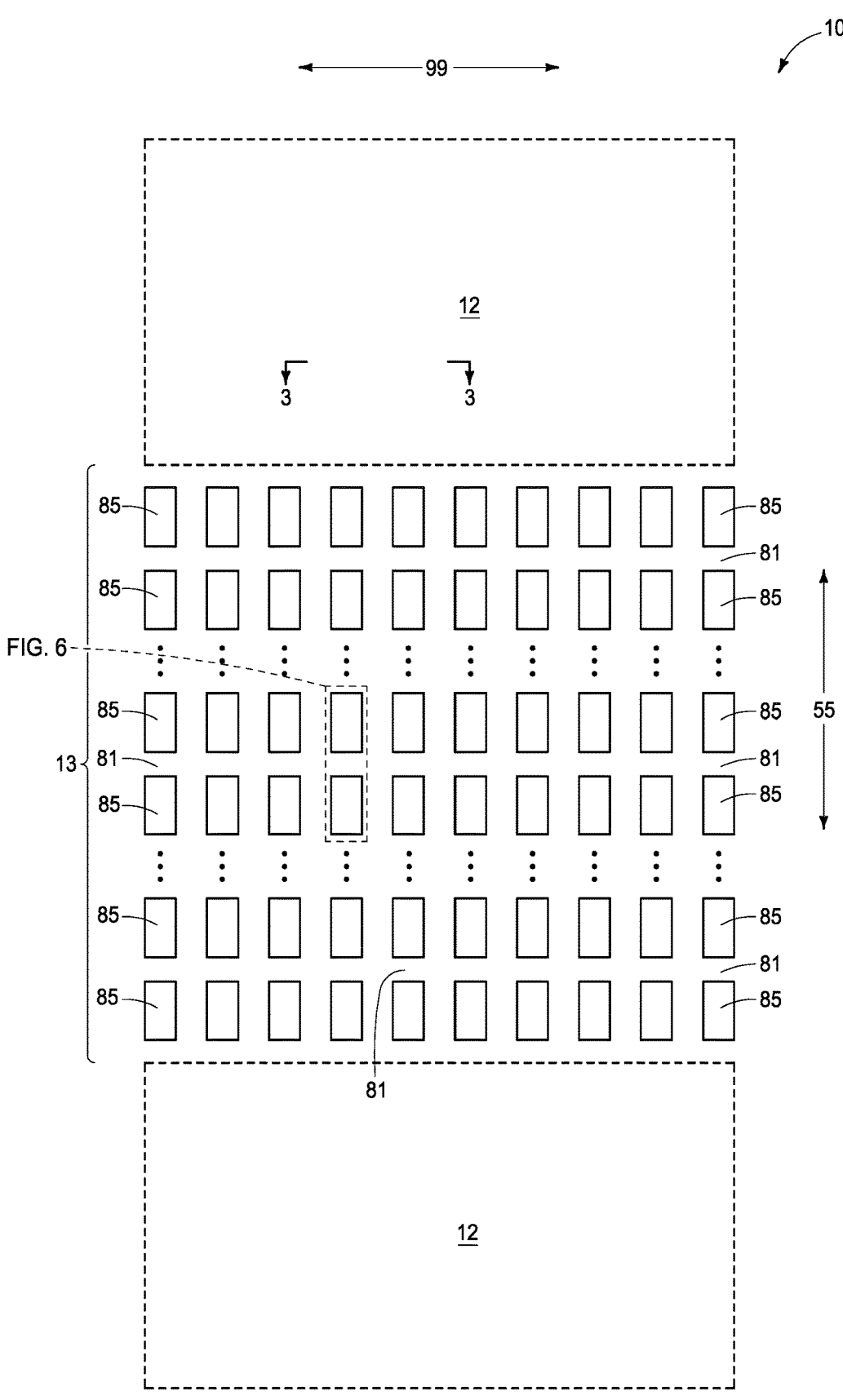
FIG. 1 is a diagrammatic view of a portion of memory circuitry in process in accordance with embodiments of the invention.
Figures 2, 3:
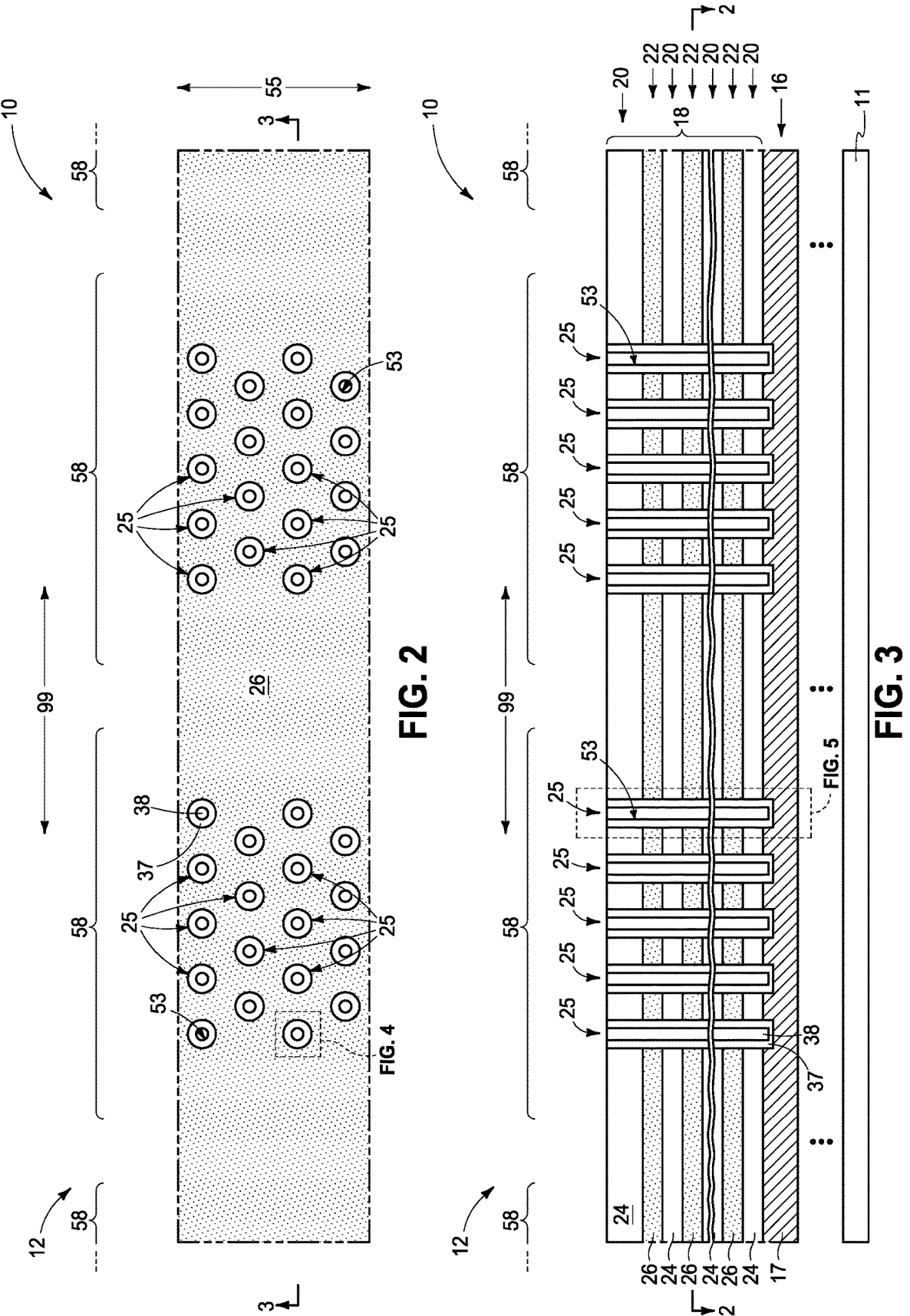
Figure 4:
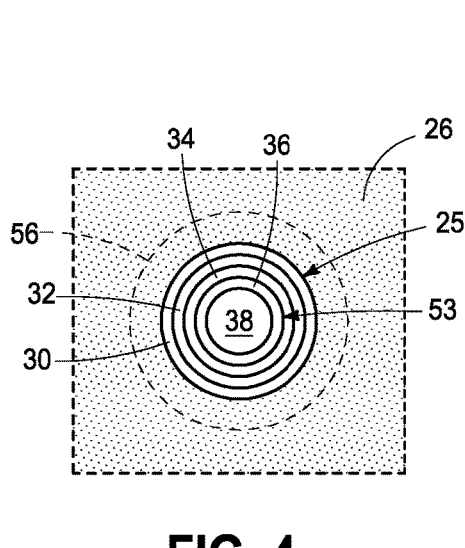

Stack 18 extends from memory-array region 12 into stair-step region 13 along first direction 55. For brevity, less tiers 20 and 22 are shown in FIGS. 3 and 5 as compared to FIG. 6, with more tiers 20 and 22 being shown in FIG. 6 for clarity and for better emphasis of aspects associated with stair-step region 13. In one embodiment, one stair-step structure (at least one) will be formed in stair-step region 13 and in another embodiment a plurality of stair-step structures will be formed in stair-step region 13. In one embodiment, a first layer 78 of imageable resist 79 (e.g., photoresist) is formed in stair-step region 13. In one embodiment, non-imageable hard-masking material 84 (e.g., silicon nitride or polysilicon) is formed prior thereto, for example whereby non-imageable hard-masking material 84 has been provided vertically between first layer 78 and stack 18. Imageable resist 79 and/or hard-masking material 84 may be formed in memory-array regions 12 (not shown). In the example embodiment, non-imageable hard-masking material 84 has been patterned (e.g., by photolithographic patterning and etch) to form openings 85 there-through that individually have a horizontal outline corresponding to those of a plurality of stair-step structures to be formed in stack 18 there-below as will be apparent from the continuing discussion.

Figure 7:
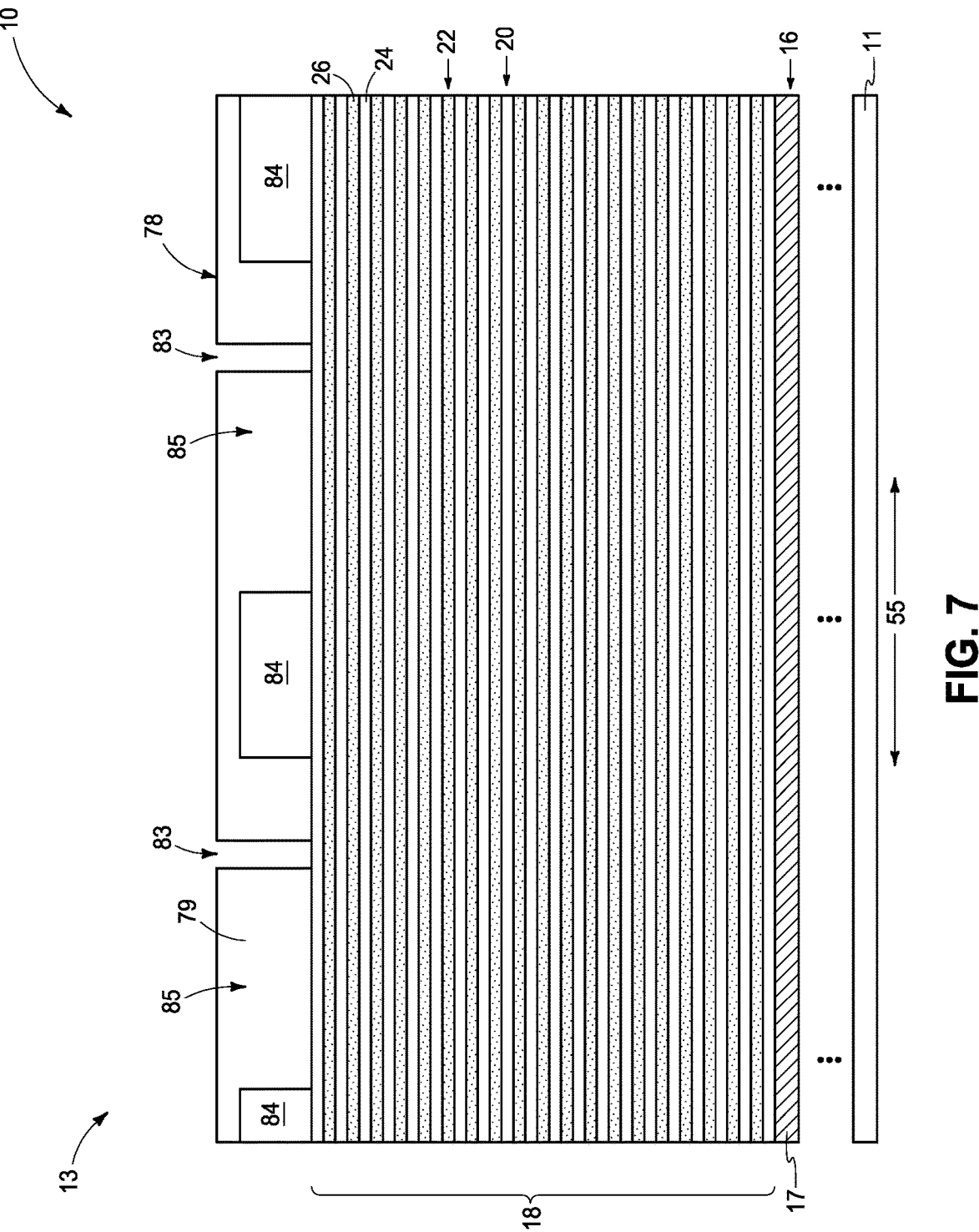

Referring to FIG. 7, first layer 78 of imageable resist 79 has been exposed to actinic radiation (e.g., ultraviolet through a mask or reticle [not shown] to change chemistry of exposed vs. unexposed portions) and then exposed first layer 78 has been developed to form a first opening 83 there-through in stair-step region 13.

Figure 8:
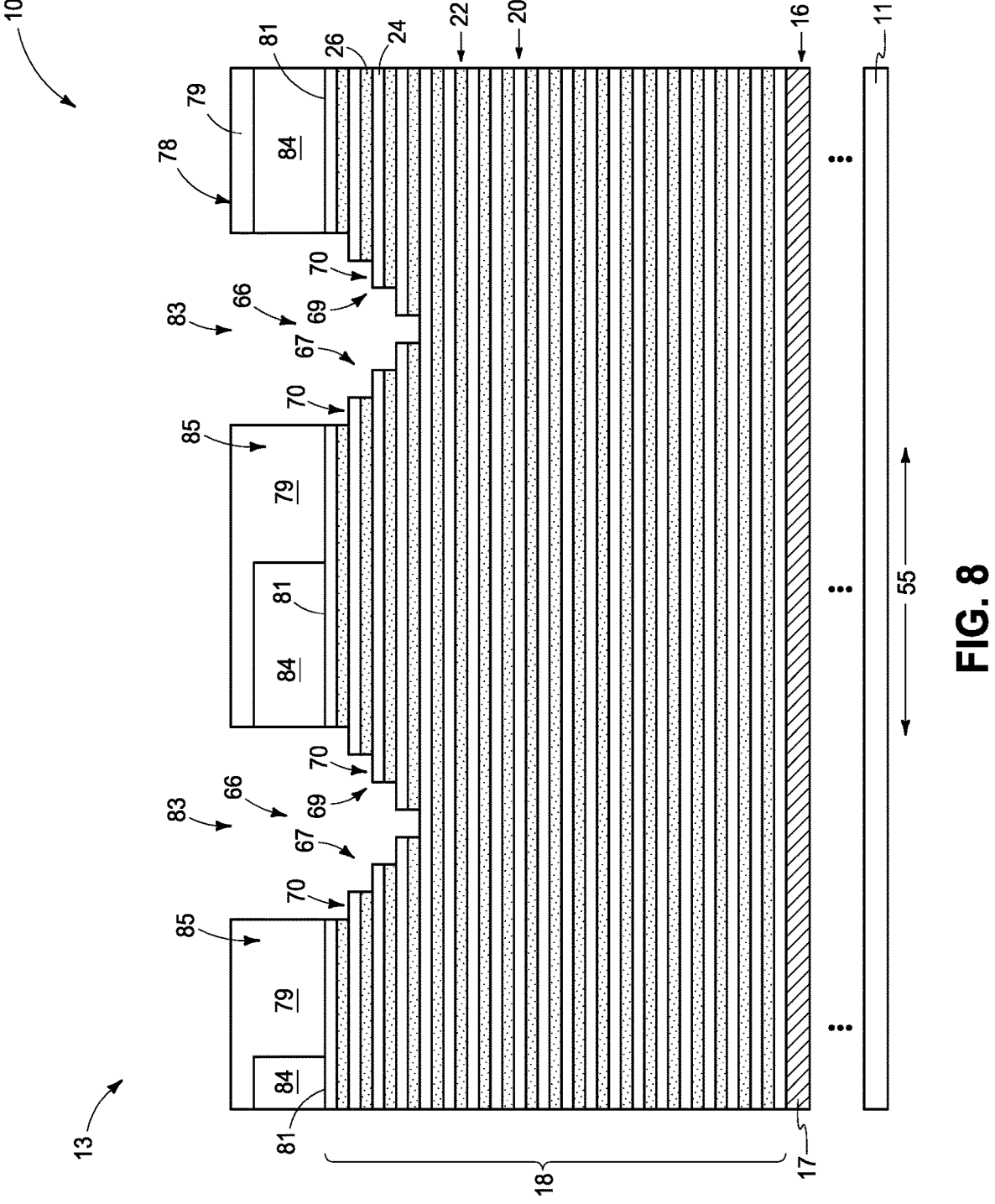
Figure 9:
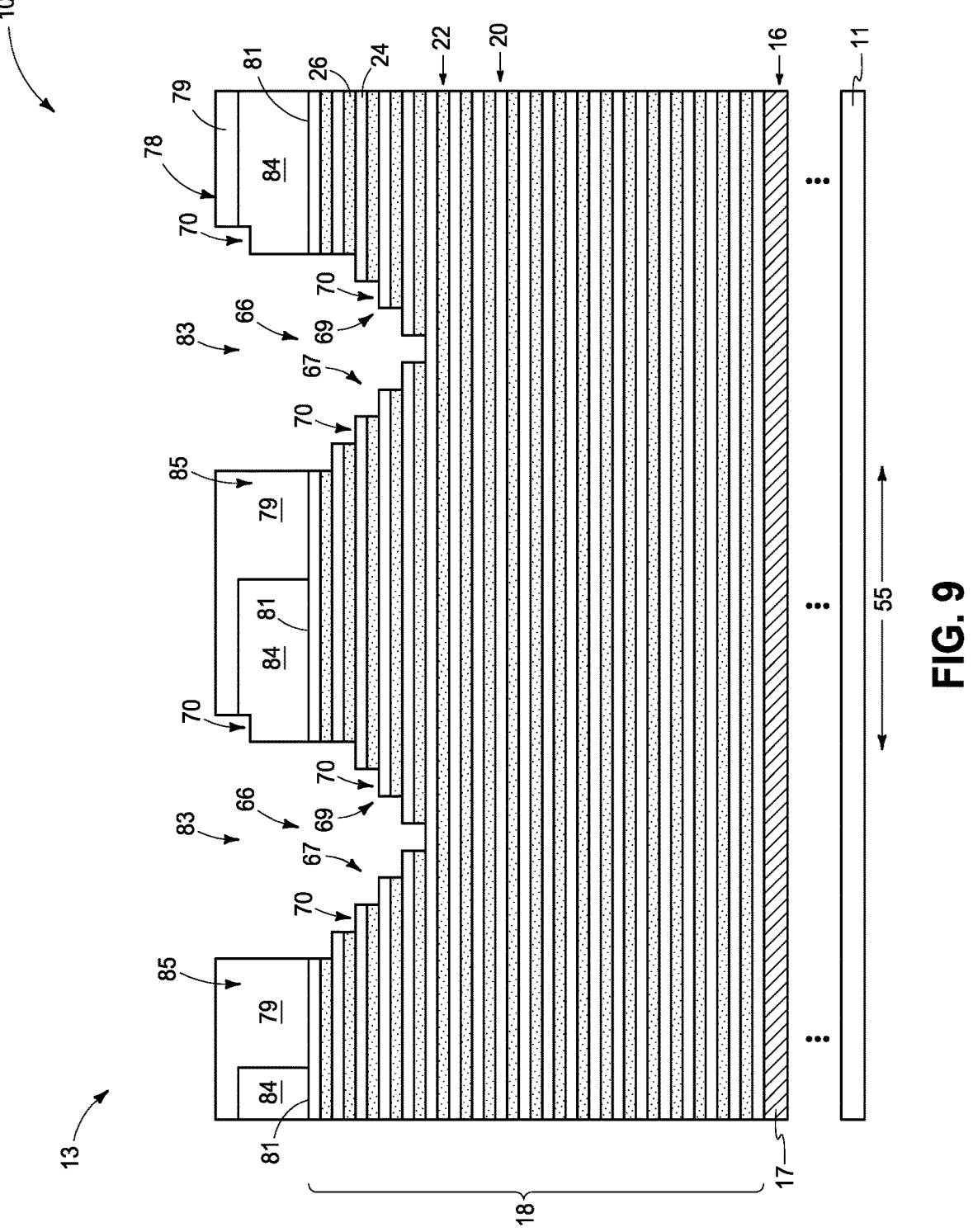

Referring to FIGS. 8 and 9, developed first layer 78 has been used in a plurality of alternating etching and lateral-trimming steps that widens first opening 83 and forms two opposing flights 67 and 69 of stairs 70* in stack 18 in stair-step region 13 (an * being used as a suffix to be inclusive of all such same-numerically-designated structures that may or may not have other suffixes). Accordingly, and thereby, stair-step structures 66 have been formed in stair-step region 13 along first direction 55, with a crest 81 being between immediately-first-direction-adjacent stair-step structures 66. Thickness of developed first layer 78 would also likely be reduced in each lateral trimming step, but is not shown for simplicity. In one embodiment, one of two opposing flights 67 and 69 is operative (e.g., flight 67) and the other of two opposing flights 67 and 69 is dummy (e.g., flight 69) in the finished-circuitry construction. In this document, a flight that is "dummy" is circuit-inoperative having stairs thereof in which no current flows in conductive material of the steps and which may be a circuit-inoperable dead end that is not part of a current flow path of a circuit even if extending to or from an electronic component. (When inoperative, operative vs. inoperative relative to flights 67 and 69 may of course be reversed.) In one such embodiment, the other of two opposing flights 67 and 69 (e.g., flight 69) has less stairs 70* than the one (e.g., flight 67) of two opposing flights 67 and 69 in the finished-circuitry construction. One or more stairs 70* may be formed in non-imageable hard-masking material 84 (when present, in one embodiment, and one stair 70* being shown in non-imageable hard-masking material 84 in FIG. 9), with in one such embodiment the one or more stairs 70* in non-imageable hard-masking material 84 being more proximate other flight 69 (the inoperative flight) of two opposing flights 67 and 69 in stack 18 than one flight 67 (the operative flight) in two opposing flights 67 and 69 in stack 18. Likely more stairs 70* will be in flights 67 and/or 69 (and/or in hard-masking material 84 when present) than shown. Example stairs 70* in stack 18 are individually shown as comprising one first tier 22 and one second tier 20 (the order of which may be reversed and not shown). More first and second tiers per stair 70* may be used, for example if forming multiple treads per stair (e.g., along second direction 99 and not shown).

Figure 10:
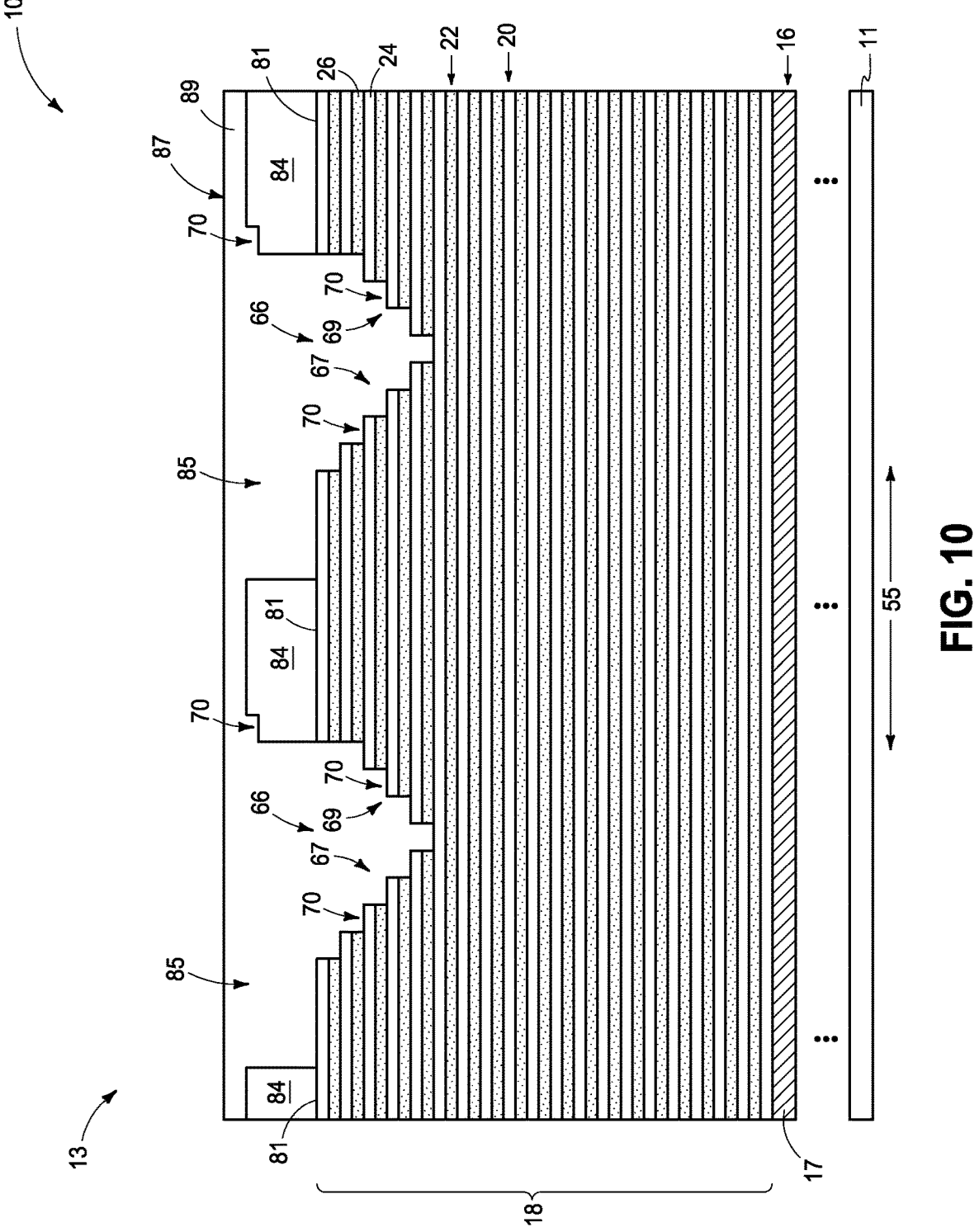

Referring to FIG. 10, a second layer 87 of imageable resist 89 (same or different composition as/from that of imageable resist 79) has been formed directly above two opposing flights 67, 69 of stairs 70*.

Figure 11:
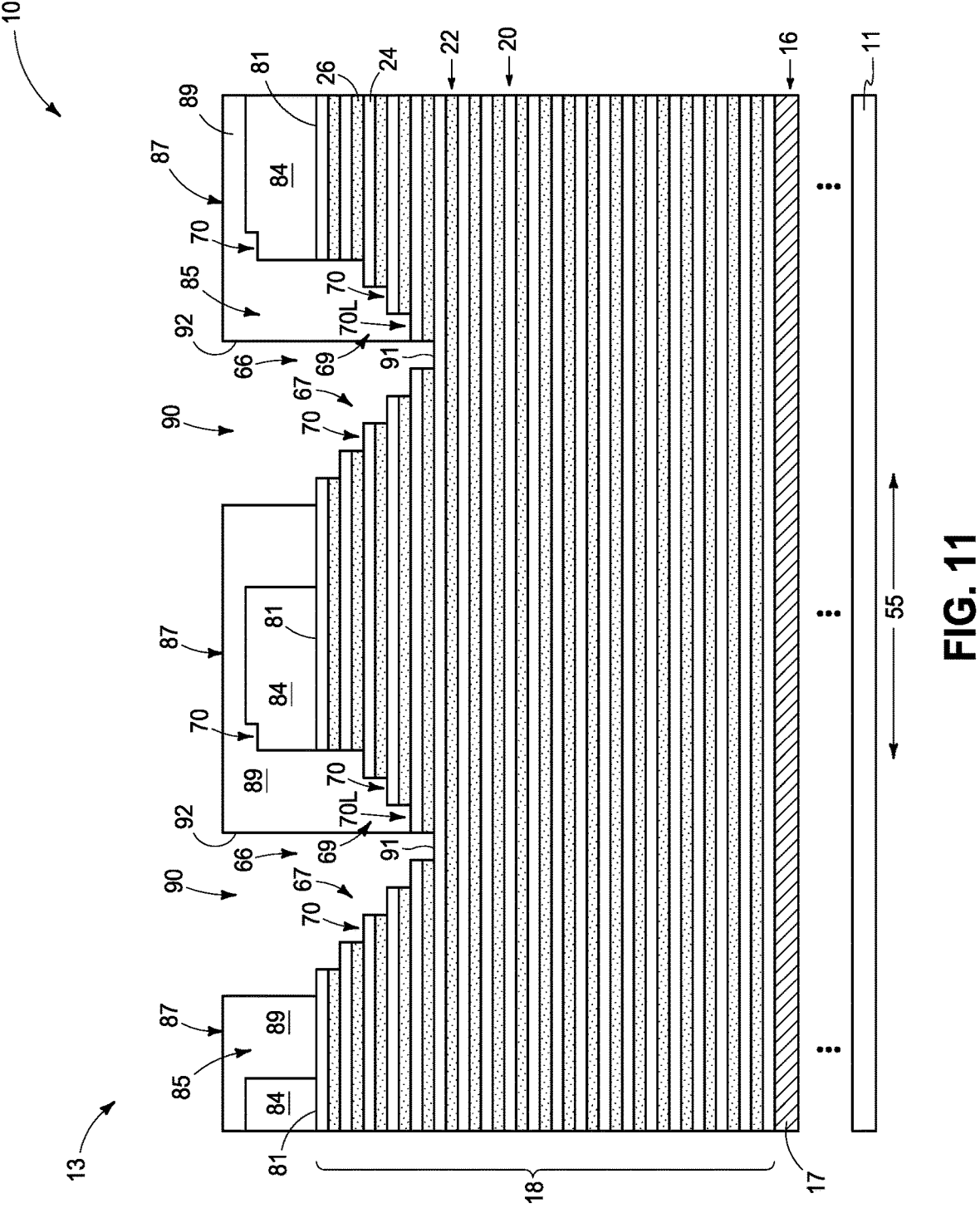
Figure 12:
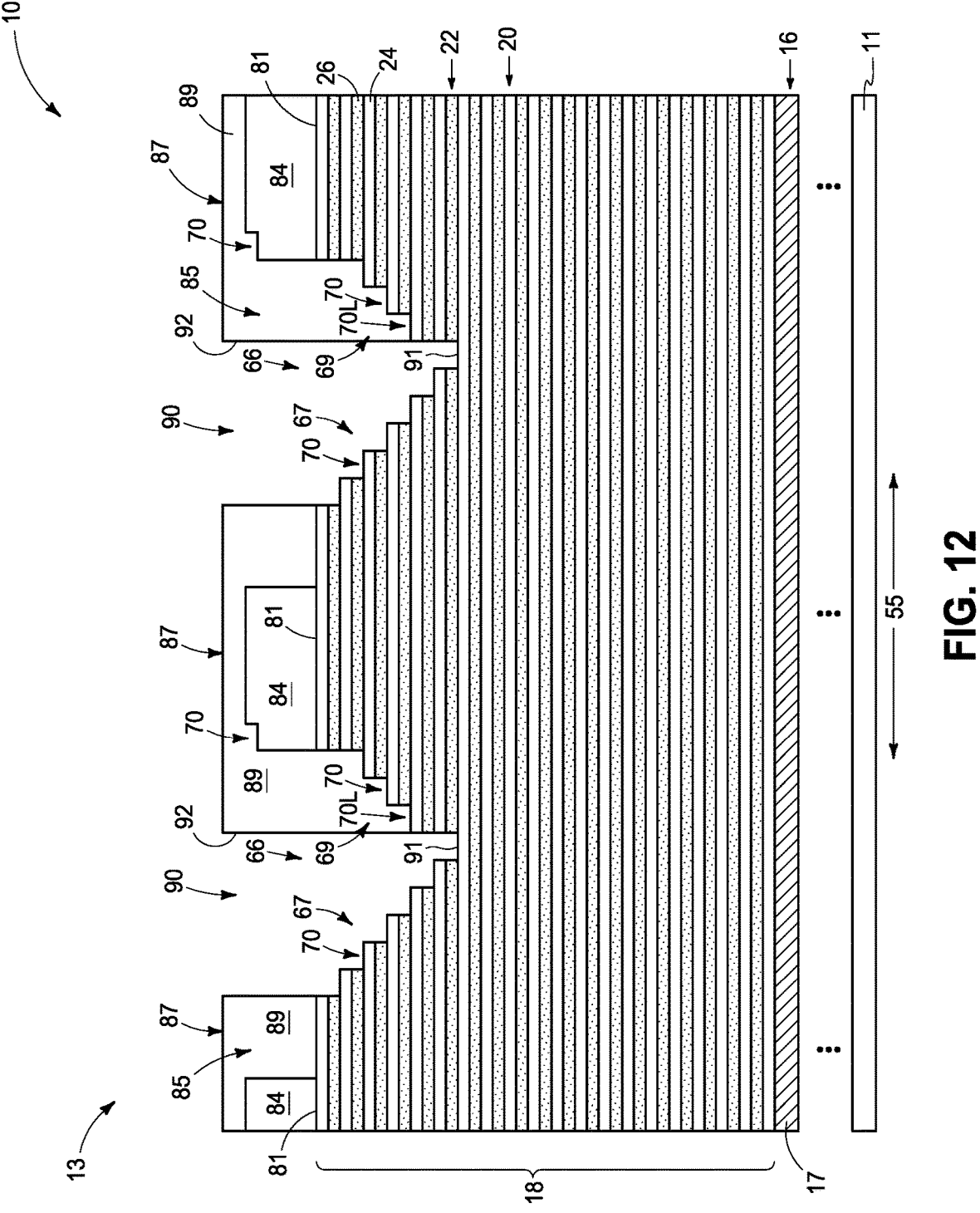
Figure 13:
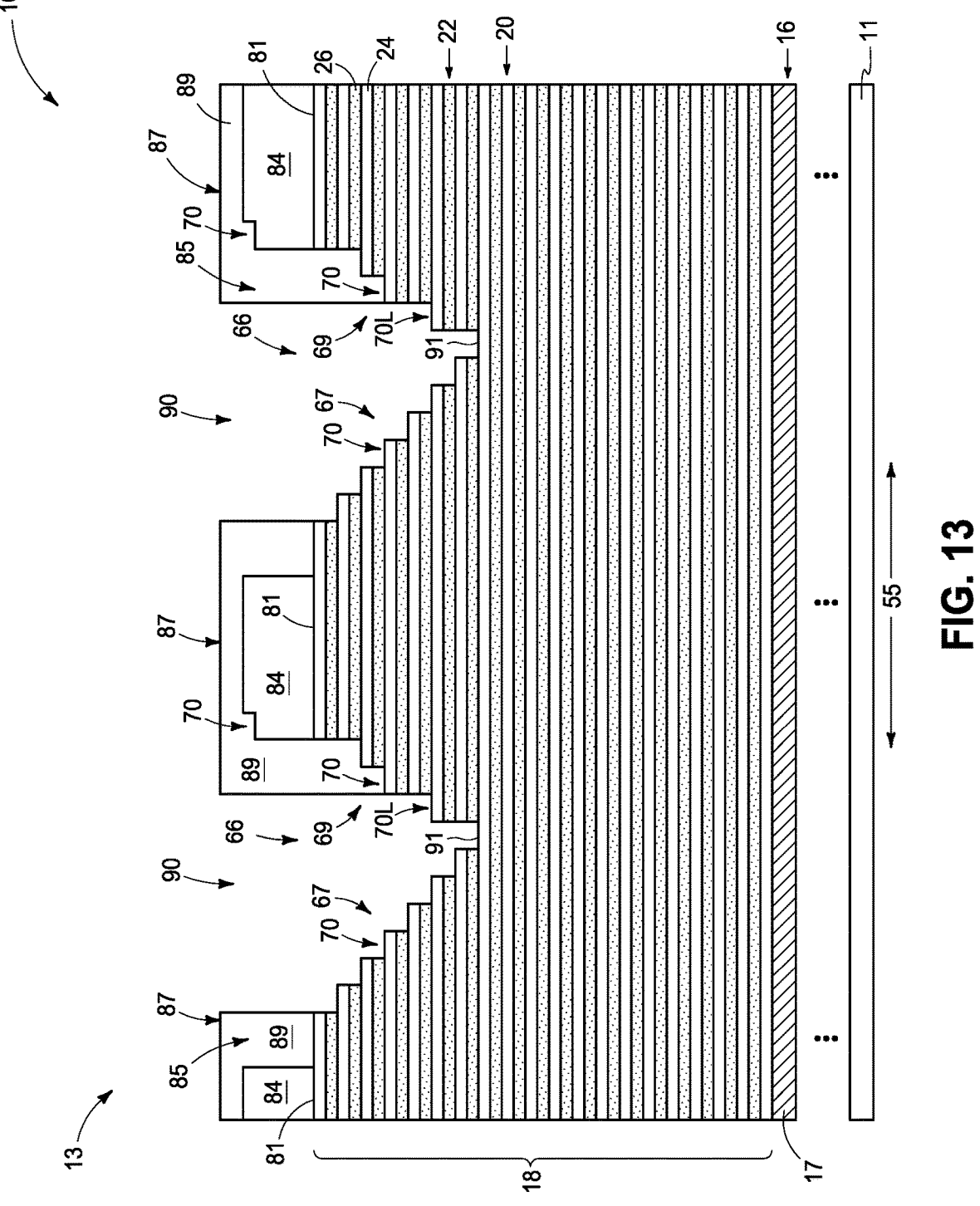
Figure 14:
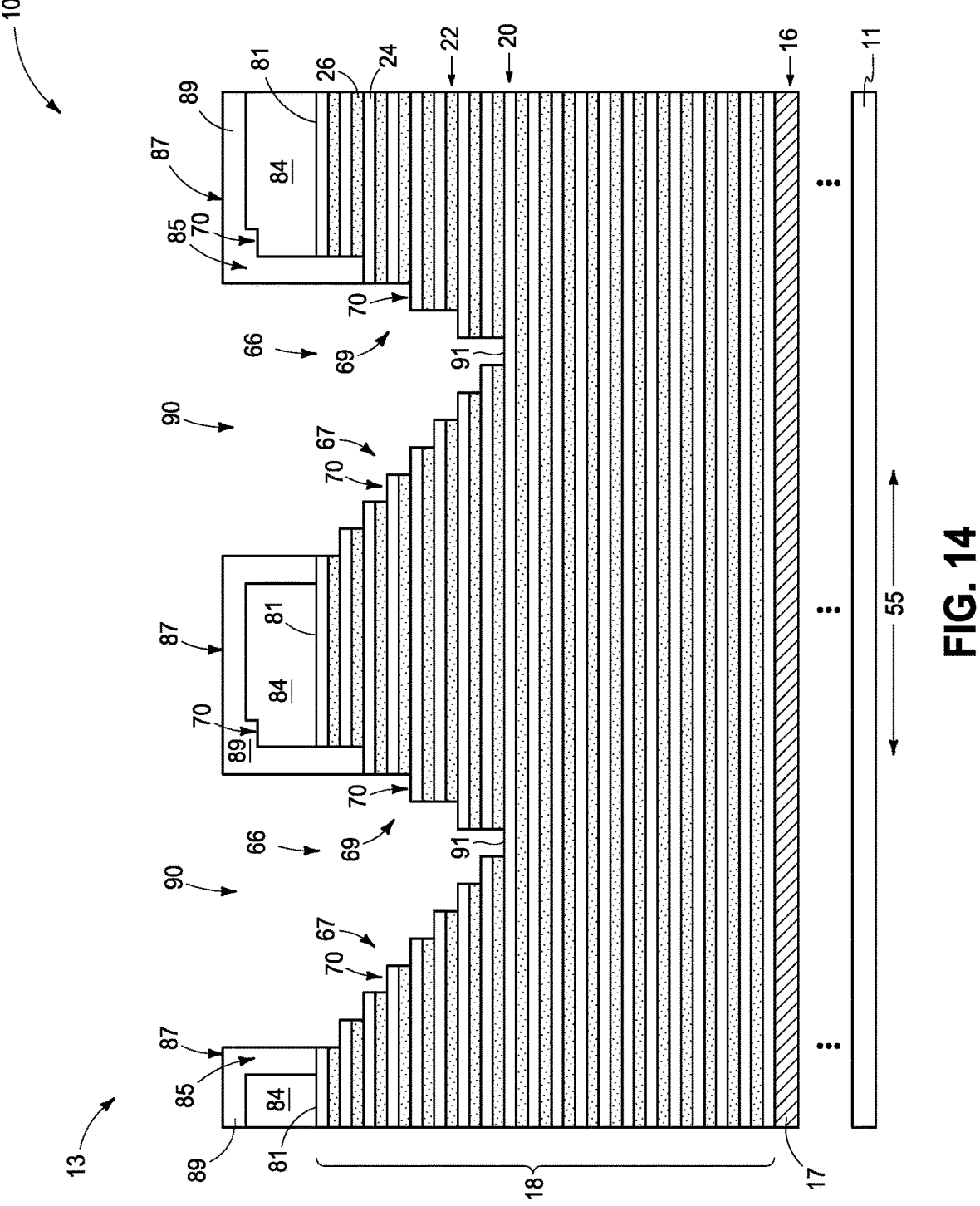
Figure 15:
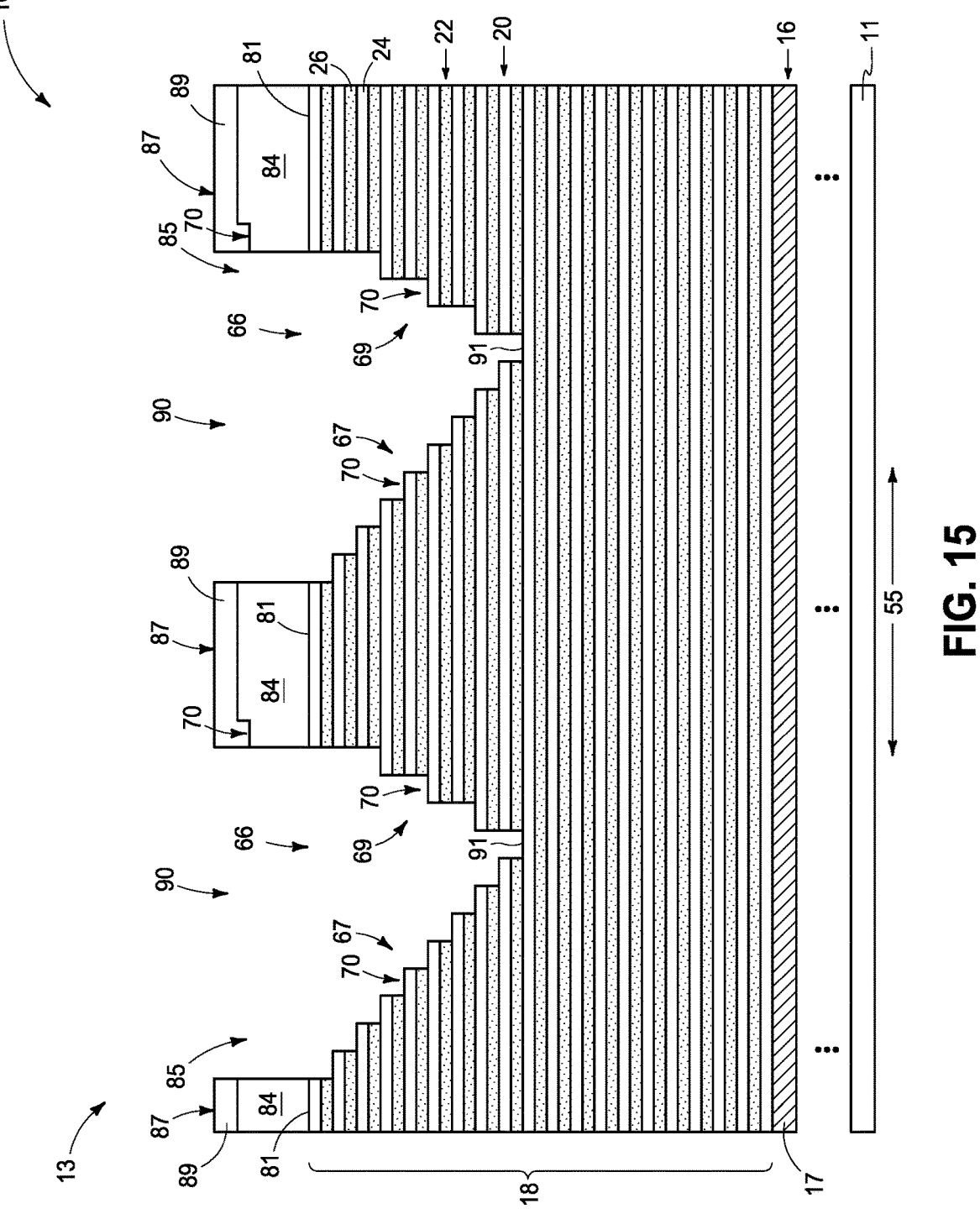

Referring to FIG. 11, second layer 87 has been exposed to actinic radiation (e.g., ultraviolet through a mask or reticle [not shown] to change chemistry of exposed vs. unexposed portions) and then exposed second layer 87 has been developed to form a second opening 90 there-through. Second opening 90 exposes all of stairs 70* of one of two opposing flights 67 and 69 (e.g., flight 67). Second layer 87 is directly above all of stairs 70* in the other of two opposing flights 67 and 69 (e.g., flight 69).

Referring to FIGS. 12-15, developed second layer 87 has been used in a plurality of alternating etching and lateral-trimming steps that widens second opening 90, lengthens at least one of two opposing flights 67 and 69 of stairs 70*, and extends two opposing flights 67, 69 of stairs 70* deeper into stack 18. Thickness of developed second layer 87 would also likely be reduced in each lateral trimming step, but is not shown for simplicity. More stairs 70* may be formed in non-imageable hard-masking material 84 (when present, in one embodiment, and not shown). Such would likely occur if there were more than the example eight stairs 70* shown in the example operative flight 67.

Figure 16:
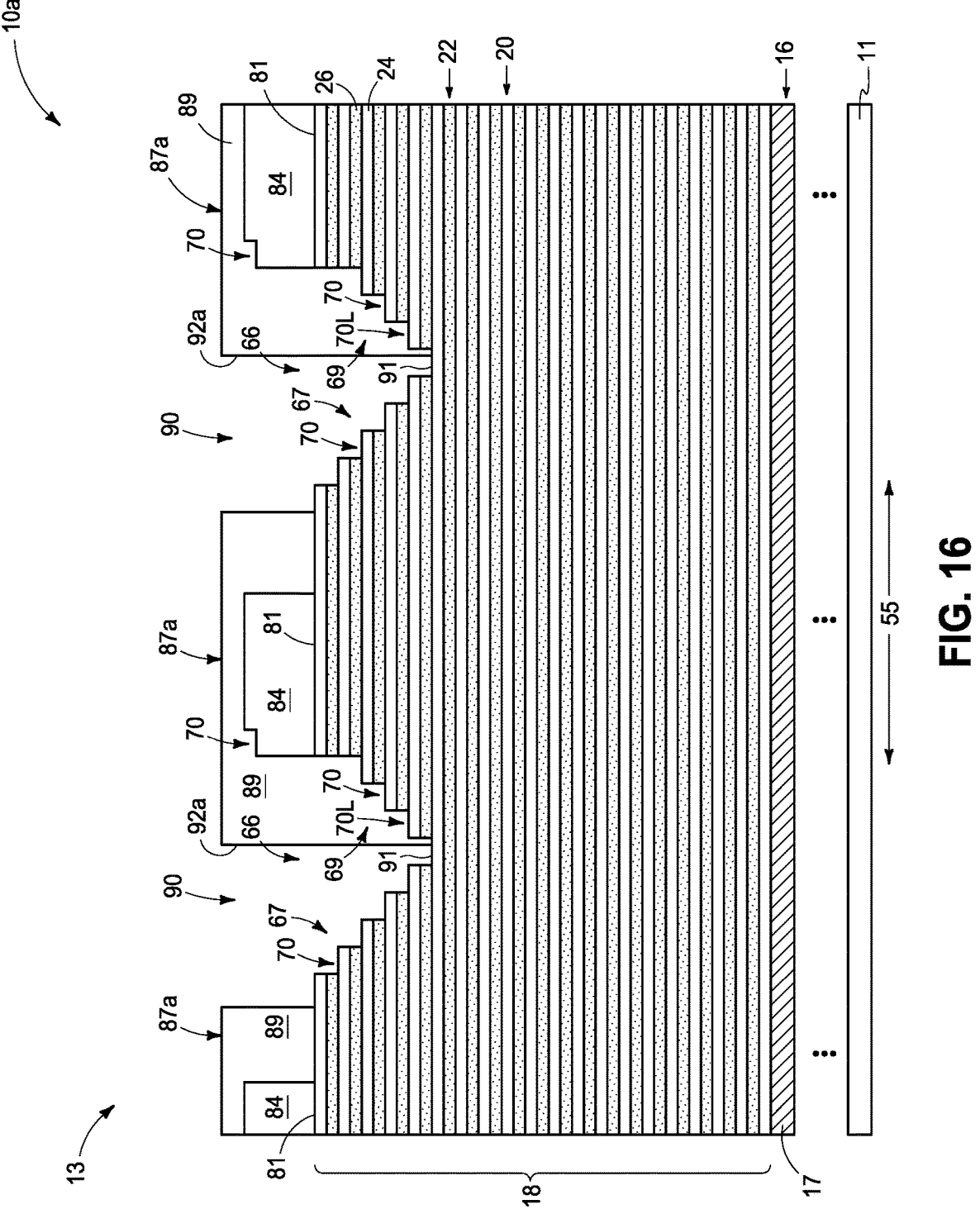
Figure 17:
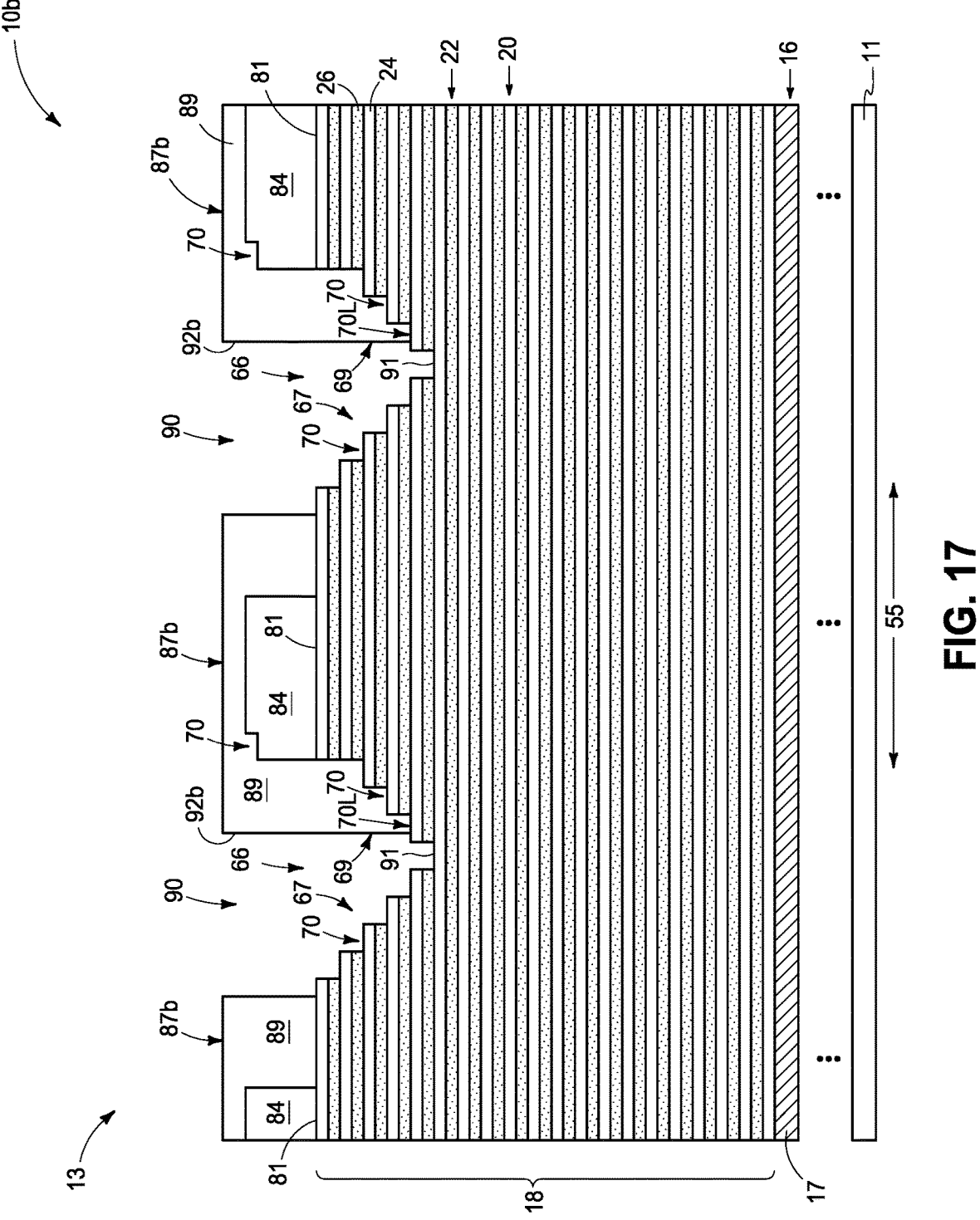

In one embodiment, second layer 87 covers all of a lowest stair 70L in other opposing flight 69 (FIG. 11) immediately-prior to the starting (FIG. 12) of the alternating etching and lateral-trimming steps that widens second opening 90, lengthens at least one of two opposing flights 67 and 69 of stairs 70*, and extends two opposing flights 67 and 69 of stairs 70* deeper into stack 18 (e.g., as is collectively shown in FIGS. 12-15). In one such embodiment, ideal, and as shown, a landing 91 is between two opposing flights 67 and 69 of stairs 70* immediately-prior (FIG. 11) to the starting (FIG. 12) and second layer 87 comprises a lateral edge 92 most-proximate landing 91 that is nowhere directly above landing 91 (e.g., being laterally-coincident with the riser of lowest stair 70L, such riser[s] being shown as being perfectly vertical although not required). Alternately, a second layer 87a comprises a lateral edge 92a that is directly above landing 91, for example as shown in FIG. 16 in a construction 10a as would occur if a mask used to form initial second opening 90 was misaligned slightly to the left. Like numerals from the above-described embodiments have been used where appropriate, with some construction differences being indicated with a suffix "a" or with different numerals. Still alternately, a second layer 87b covers less-than-all of lowest stair 70L in other flight 69 immediately-prior to the starting, for example as shown in FIG. 17 in a construction 10b as would occur if a mask used to form initial second opening 90 was misaligned slightly to the right. Like numerals from the above-described embodiments have been used where appropriate, with some construction differences being indicated with a suffix "b" or with different numerals.

Figure 18:
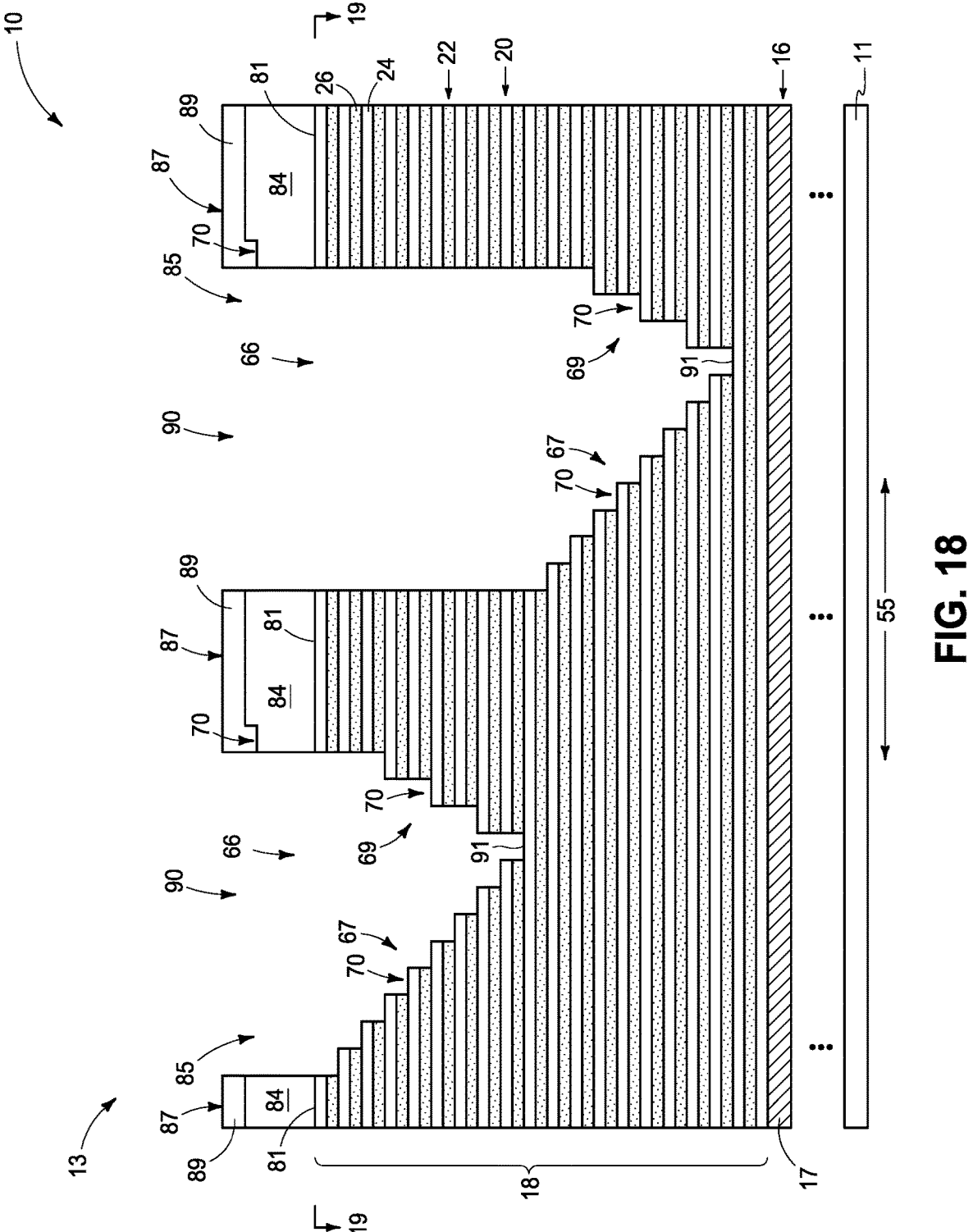
Figure 19:
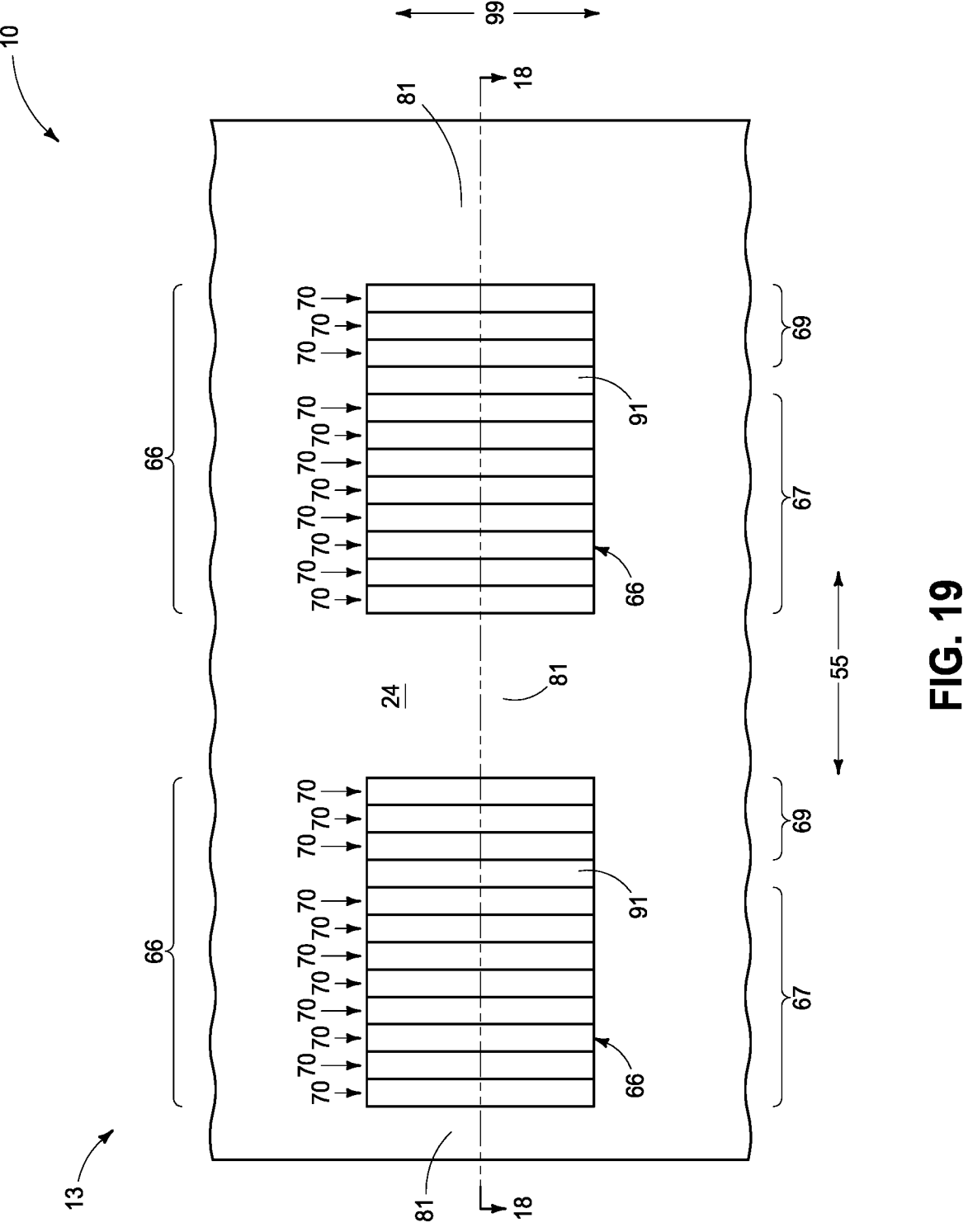
Figure 20:
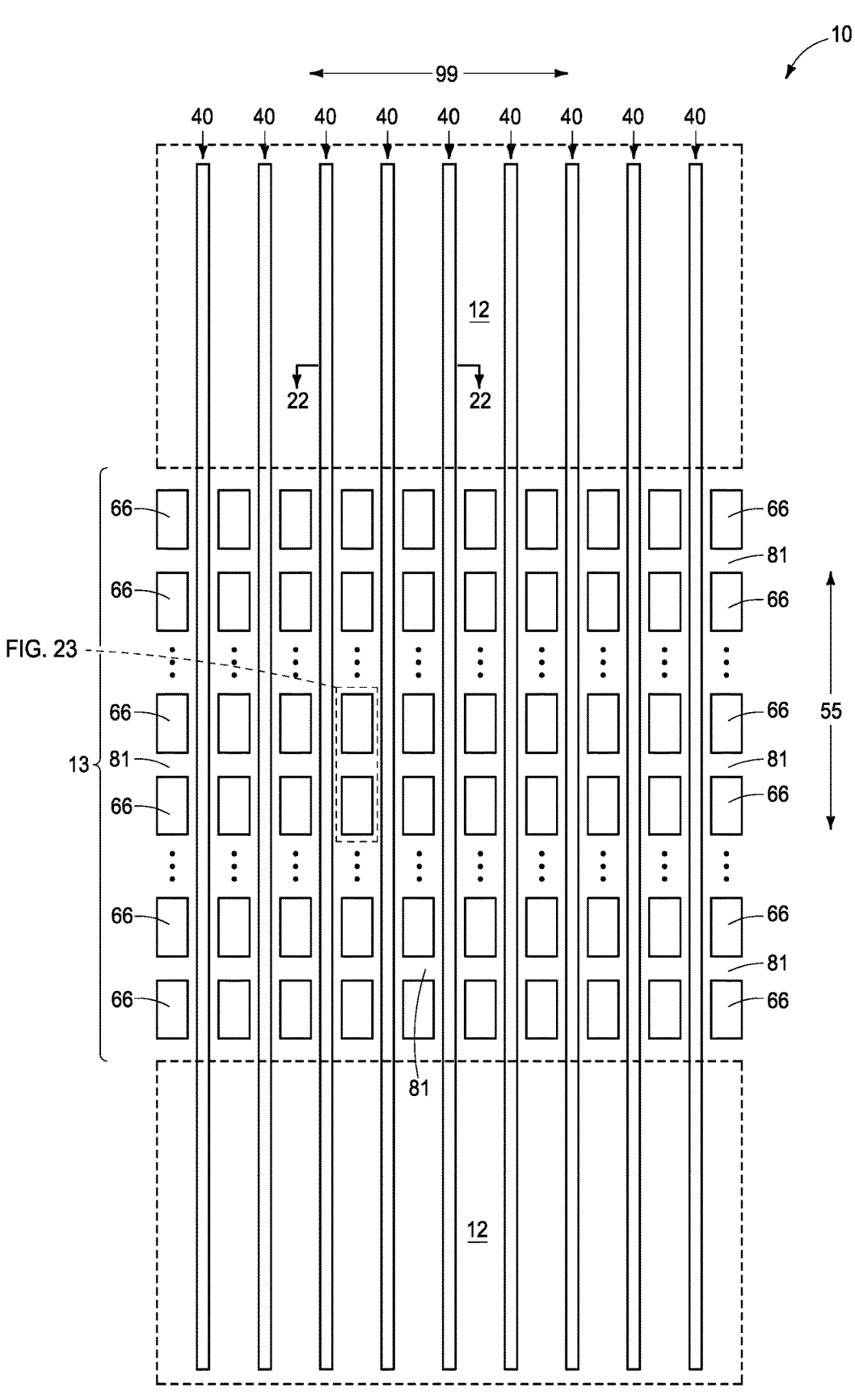
Figures 21, 22:
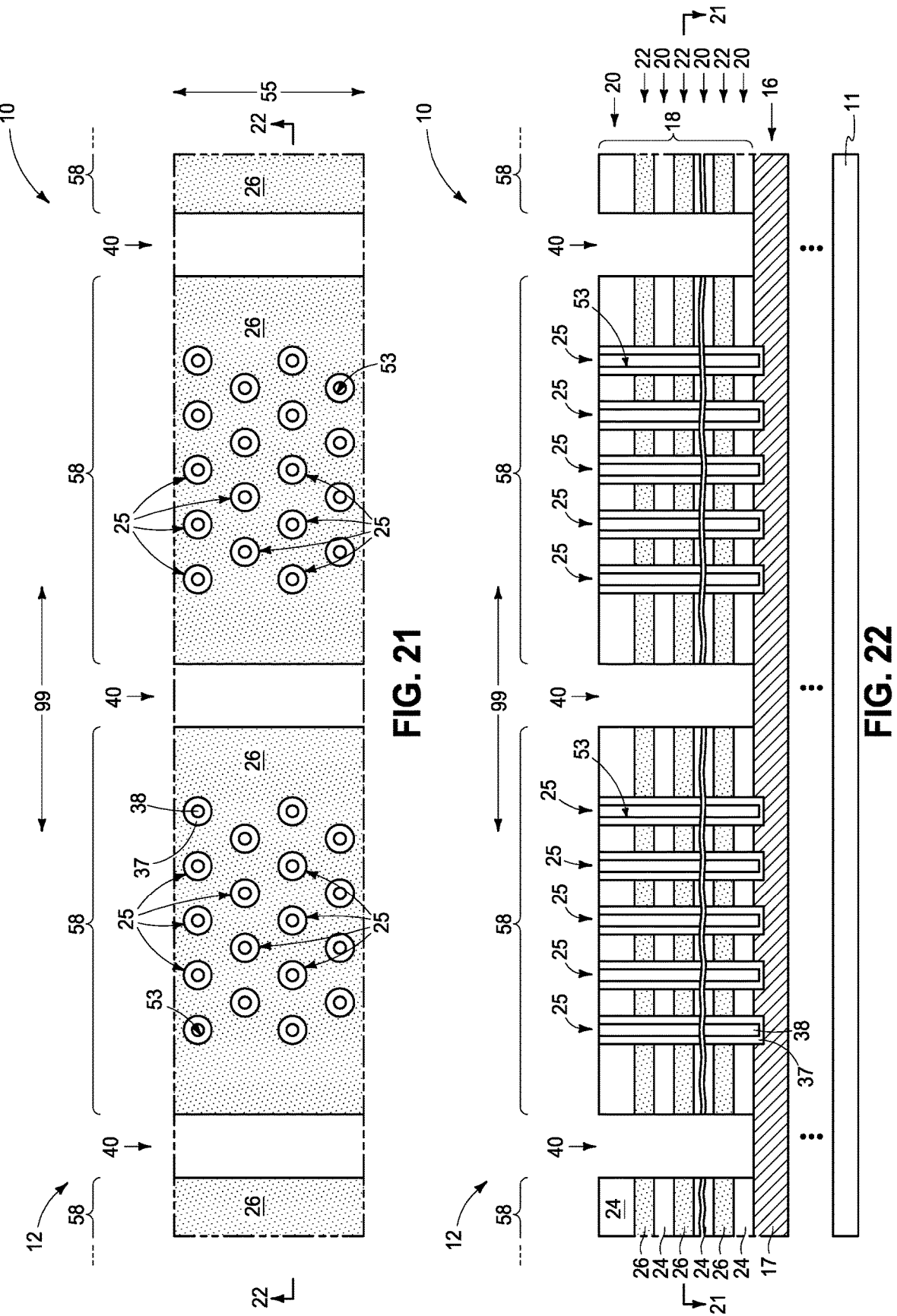
Figure 23:
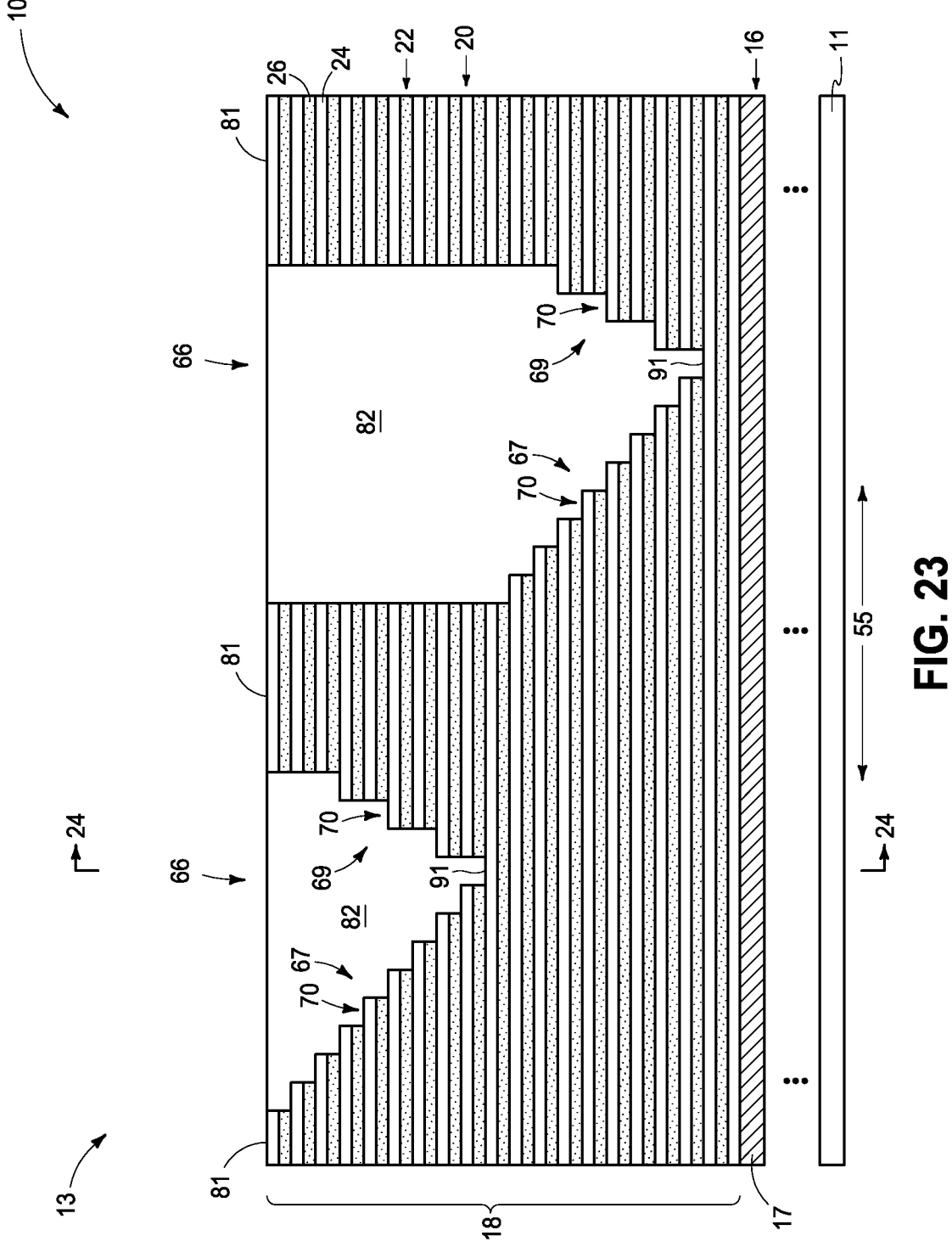
Figure 24:
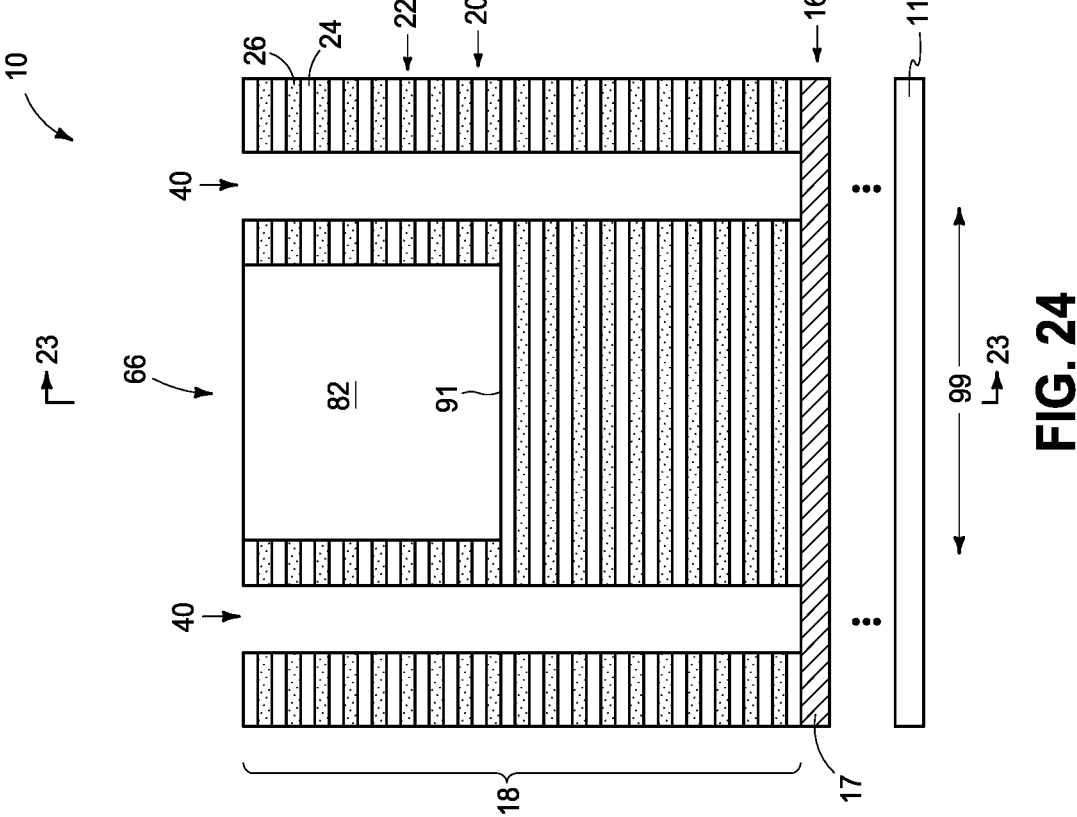
Figure 25:
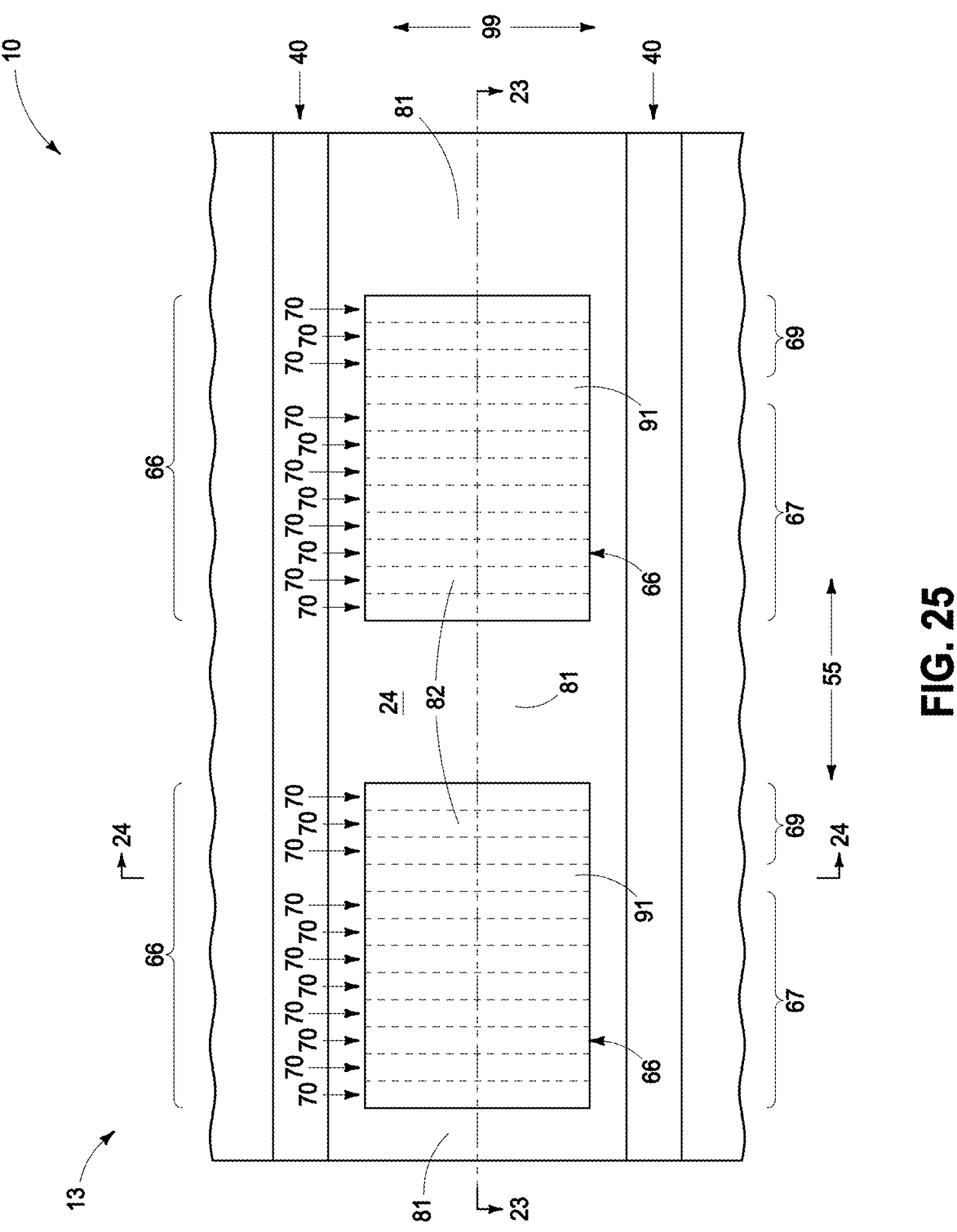
Figure 26:
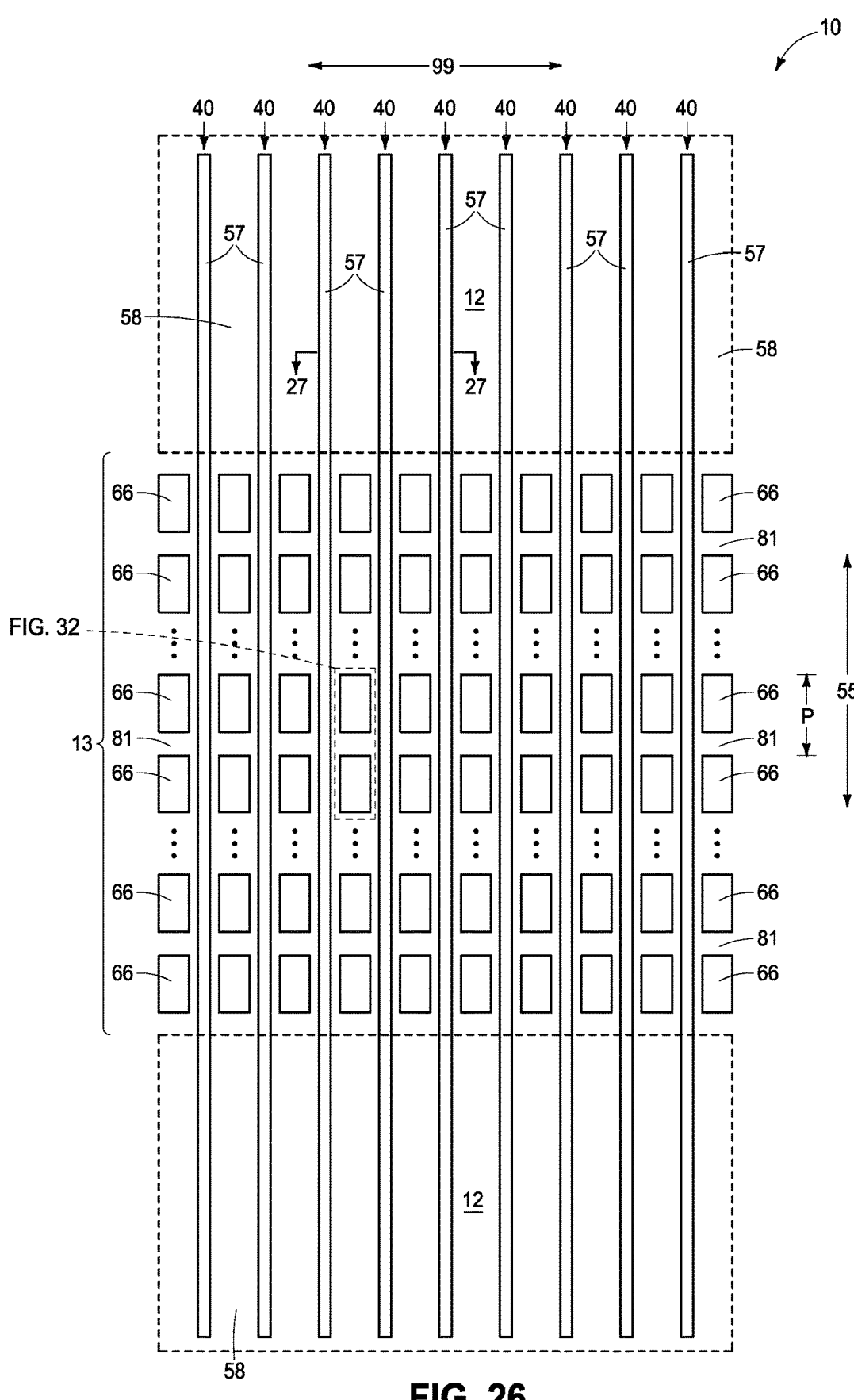
Figures 27, 28:
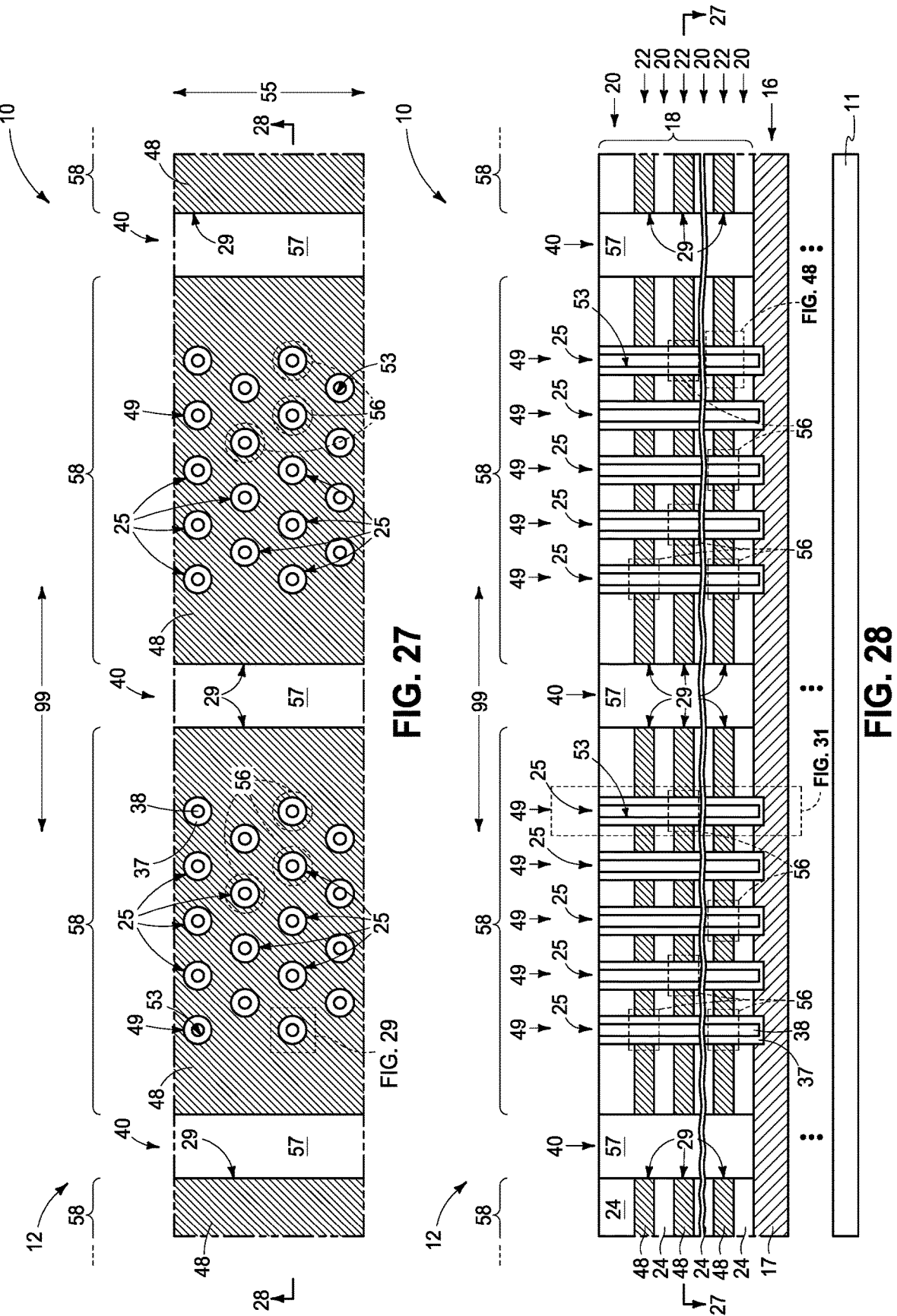
Figure 32:
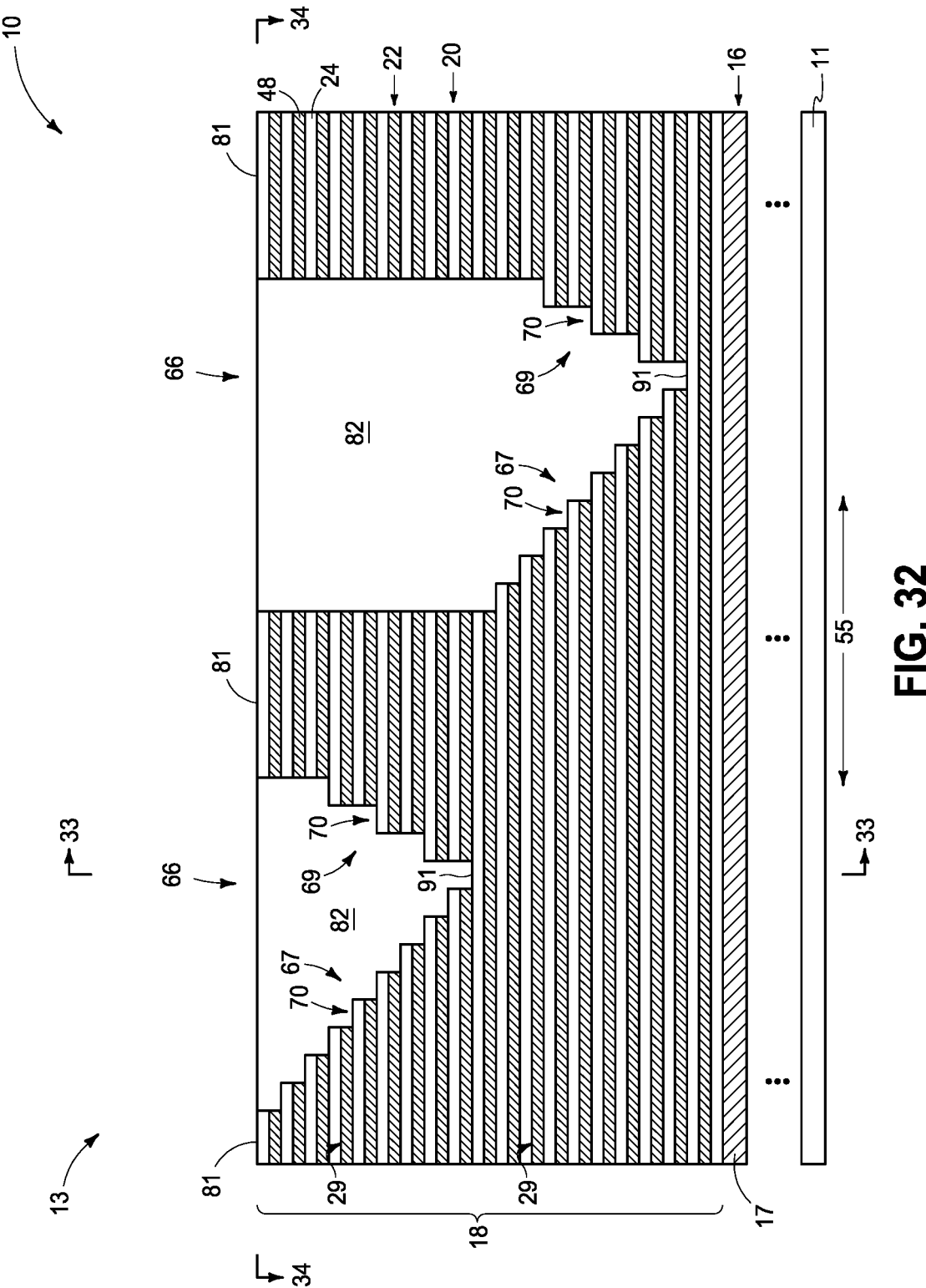
Figure 33:
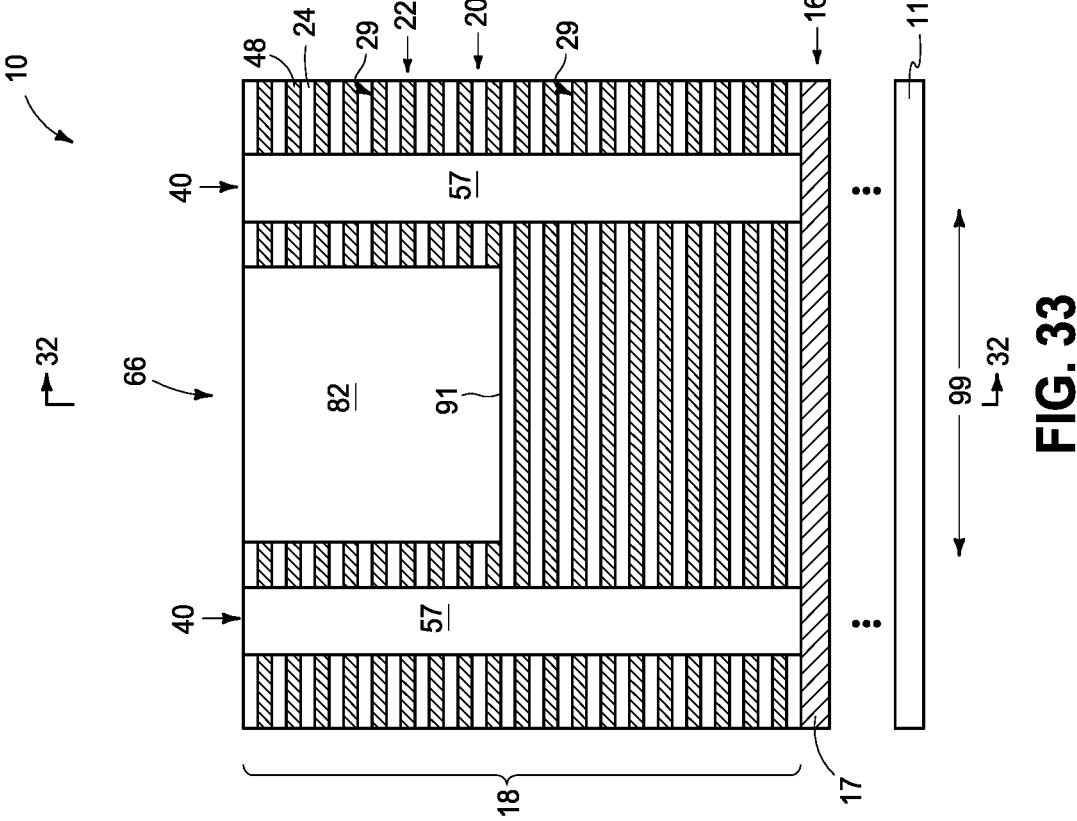
Figure 34:
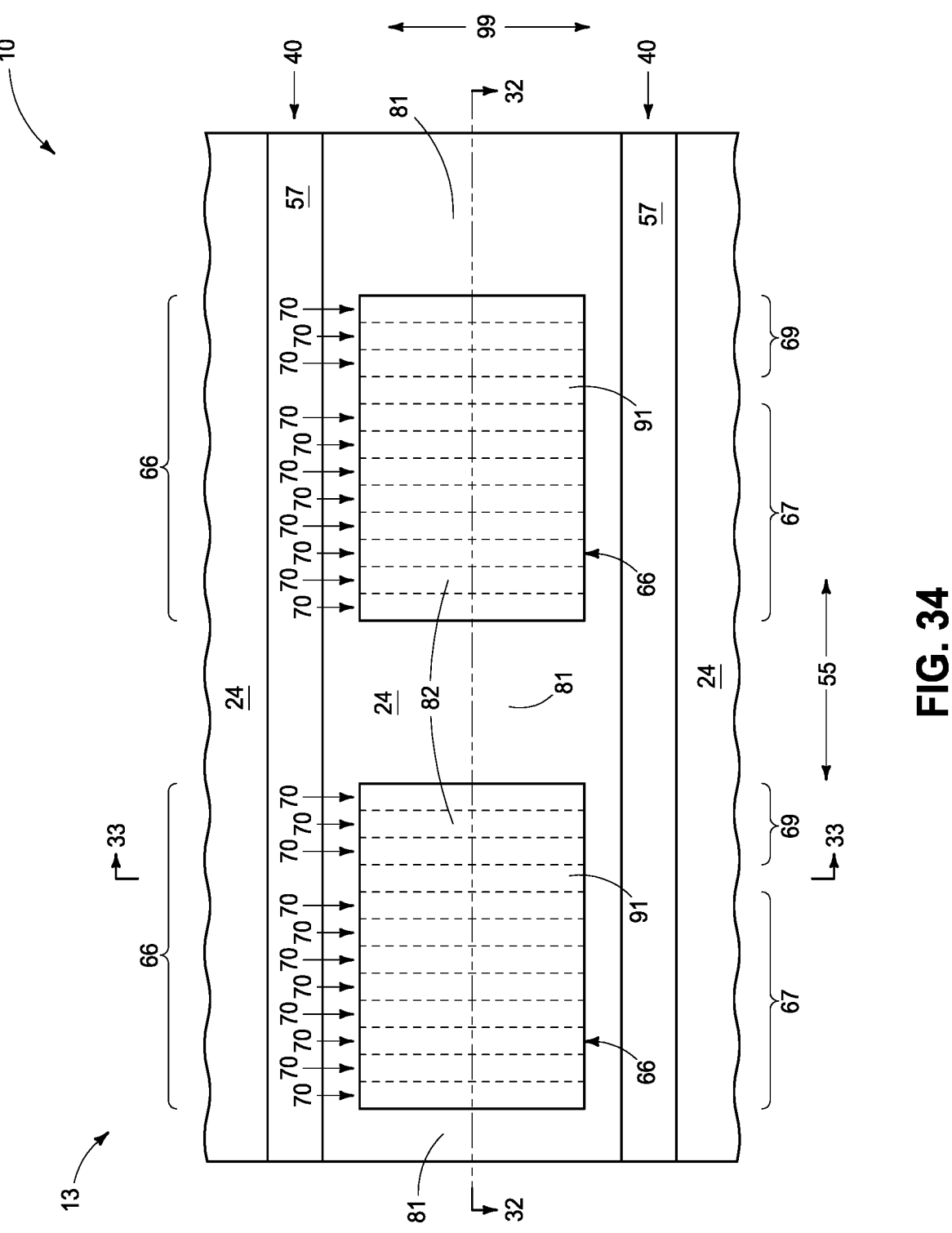

Referring to FIGS. 18 and 19, and by way of example only, the right-depicted stair-step structure 66 has been extended (translated) deeper into stack 18, for example by anisotropic etching while the left-depicted stair-step structure 66 is masked (not shown).

Referring to FIGS. 20-25, insulative material 82 has been formed directly above stair-step structures 66 (e.g., a combination of a silicon-nitride liner having silicon dioxide thereover). Hard-masking material 84 has been removed from being above stack 18 (when present and optionally) before or after forming insulative material 82. Horizontally-elongated trenches 40 have then been formed into stack 18 (e.g., by anisotropic etching) and which are individually between immediately-laterally-adjacent memory-block regions 58, with memory-block regions 58 extending into stair-step region 13. Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally-inward and/or outward in vertical cross-section (not shown). Conductive vias to stairs 70 (described below and not-yet-shown) and through-array-vias (TAVs, and not shown) in stair-step region 13 may be formed before or after forming trenches 40. Stair-step structures 66 may be laterally-spaced inwardly from immediately-laterally-adjacent trenches 40 (as shown) or may not be so spaced (not shown), for example depending on whether operative stair flight 67 is directly electrically coupled to only one or to both of two memory-array regions 12.

Referring to FIGS. 26-34, material 26 (not shown) of first tiers 22 has been removed, for example by being isotropically etched away through trenches 40 ideally selectively relative to the other exposed materials (e.g., using liquid or vapor H$_3$PO$_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18.

A thin insulative liner (e.g., Al$_2$O$_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished-circuitry construction. Example insulative materials are one or more of SiO$_2$, Si$_3$N$_4$, and Al$_2$O$_3$. Intervening material 57 may include through-array vias (not shown).

Figure 35:
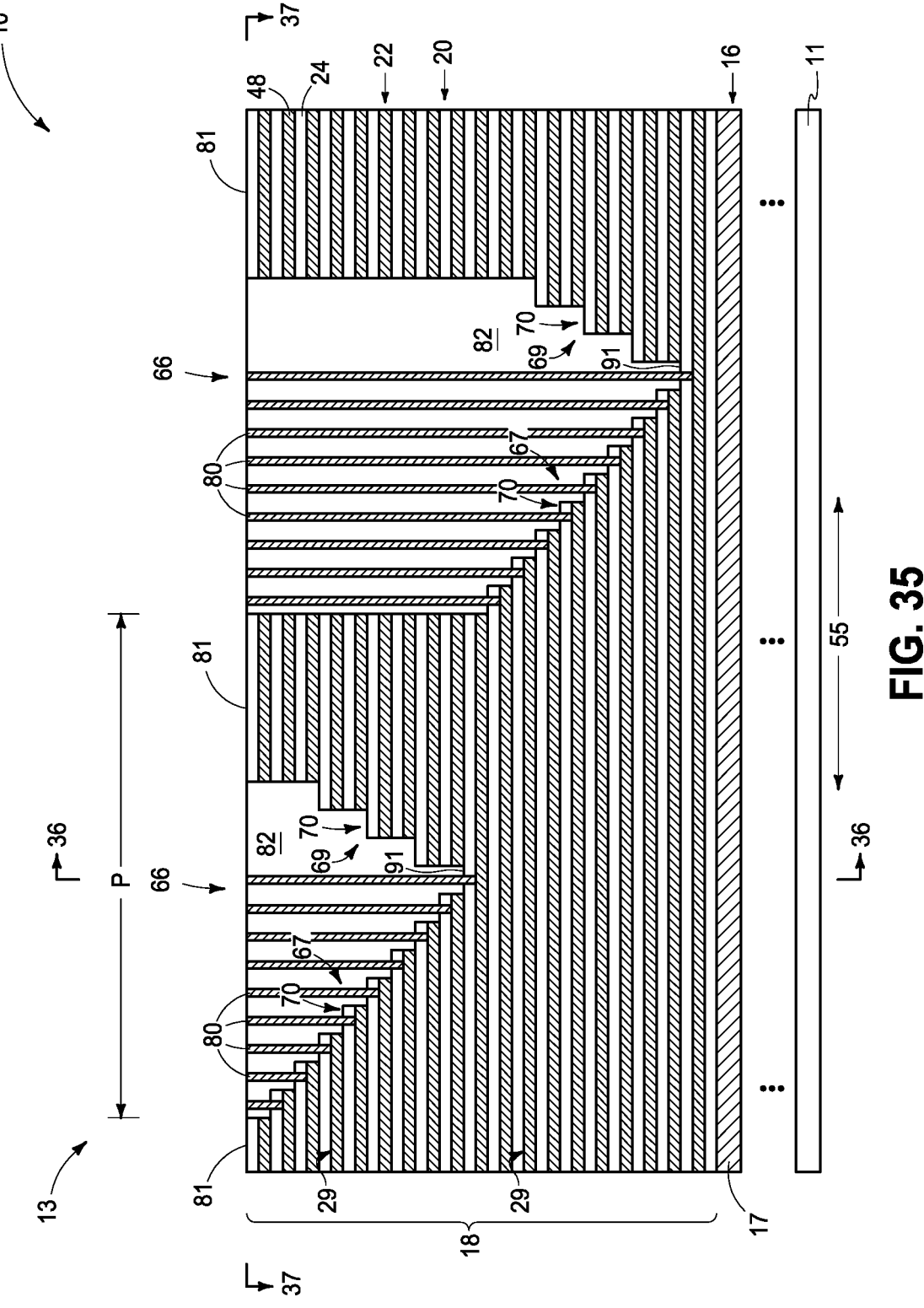
Figure 36:
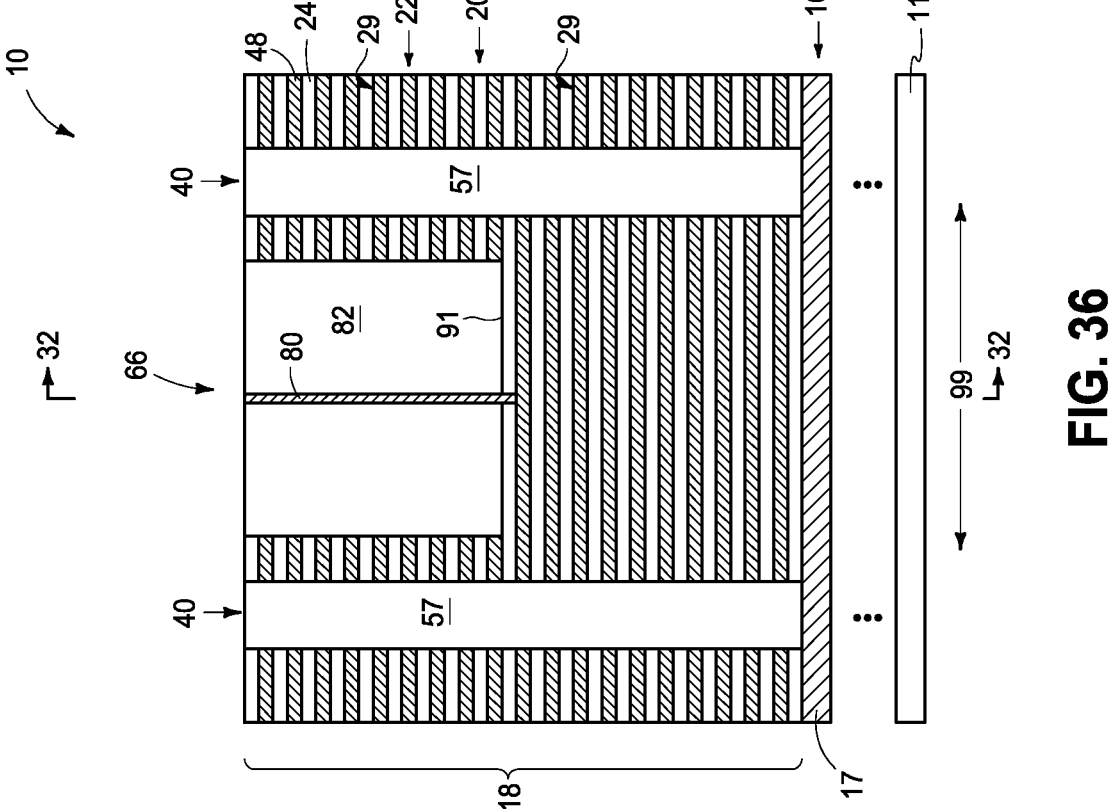
Figure 37:
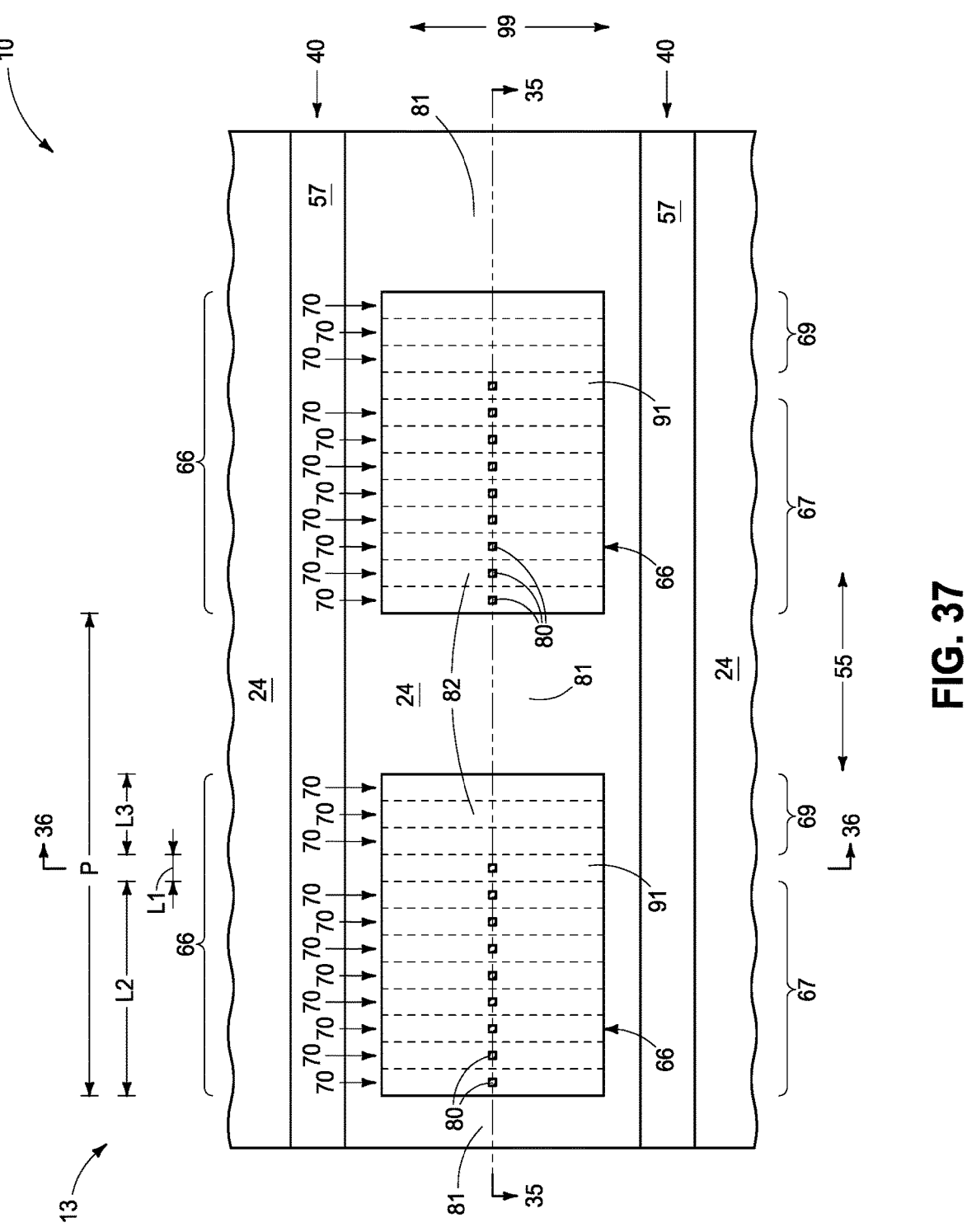
Figure 38:
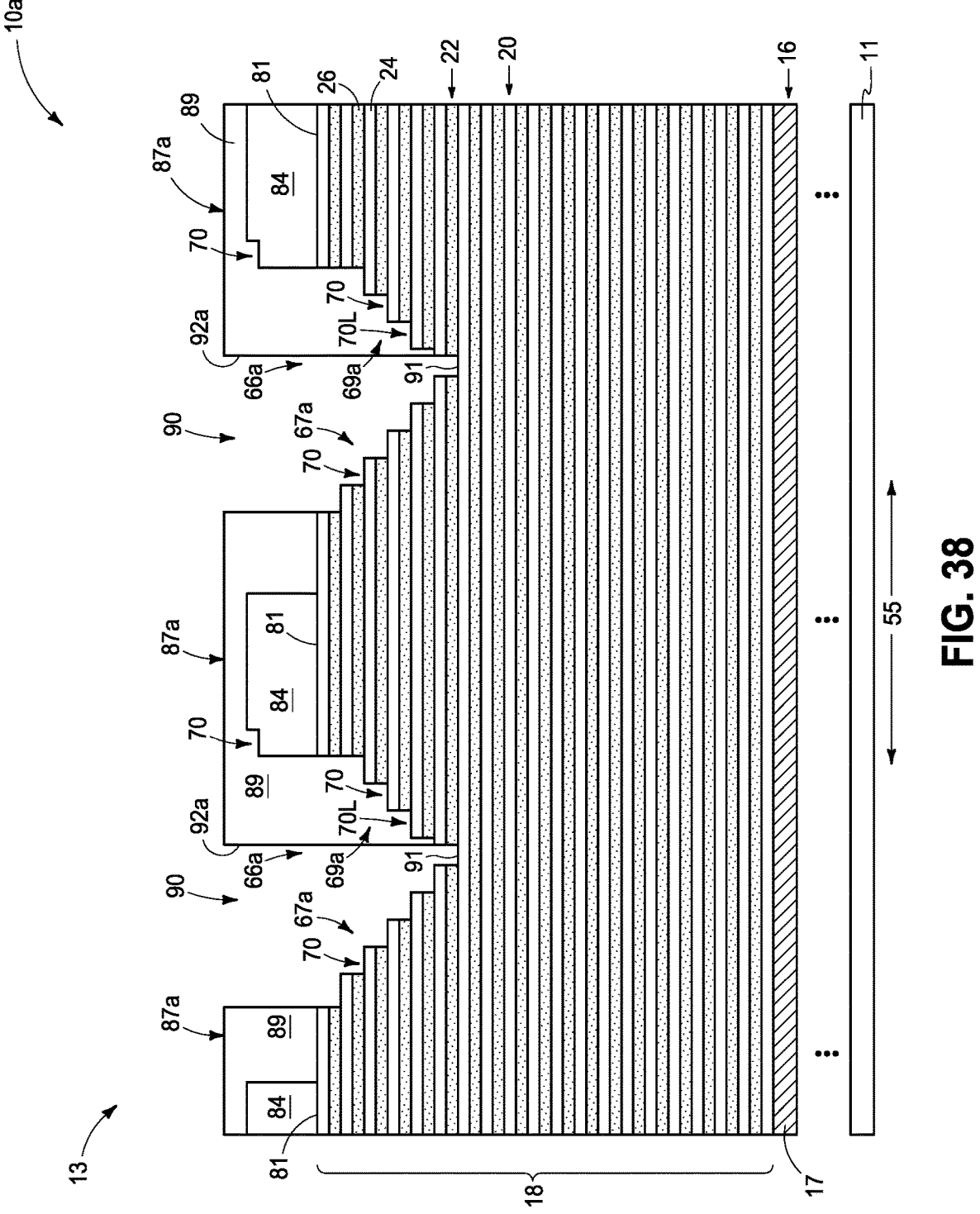
Figure 39:
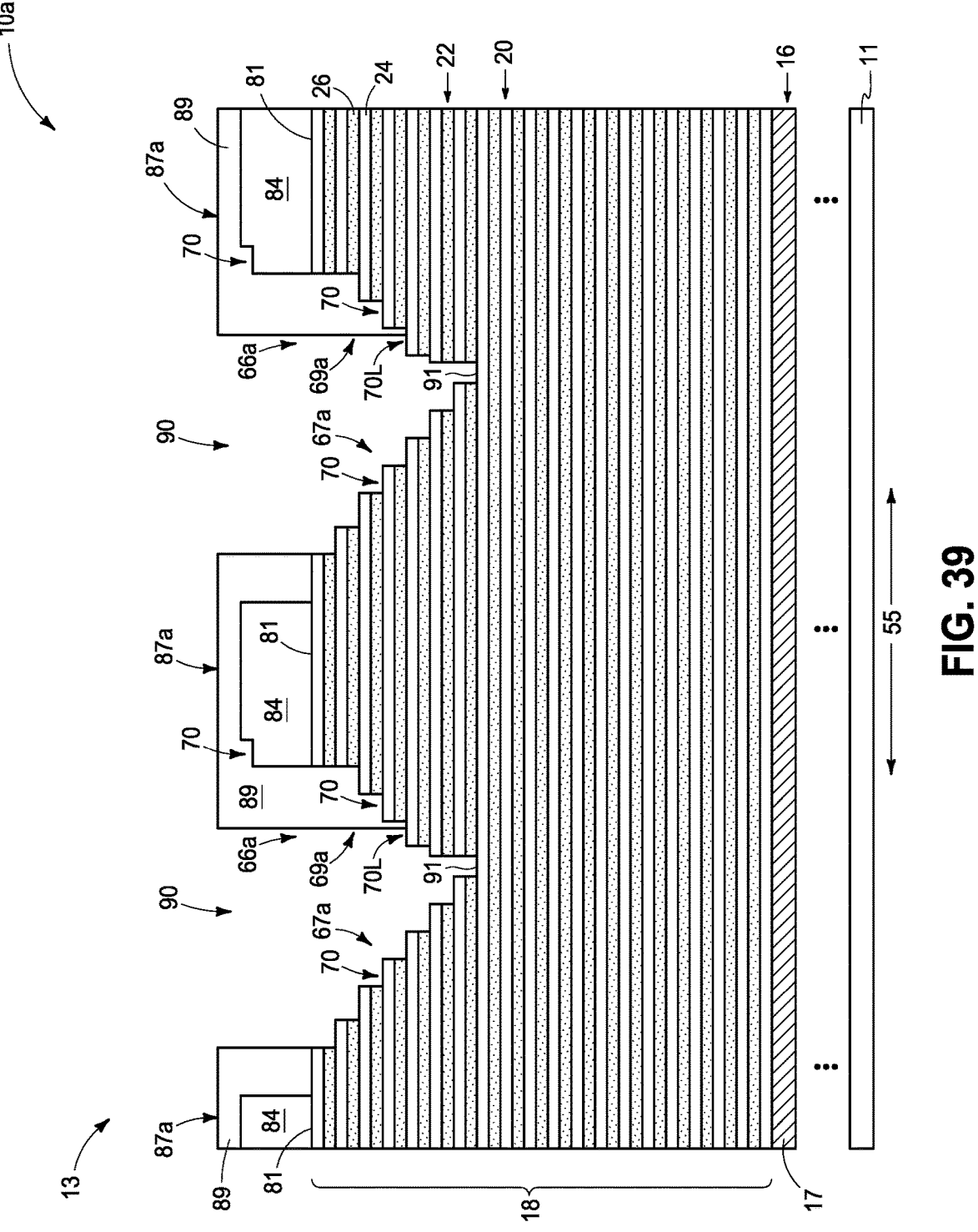
Figure 40:
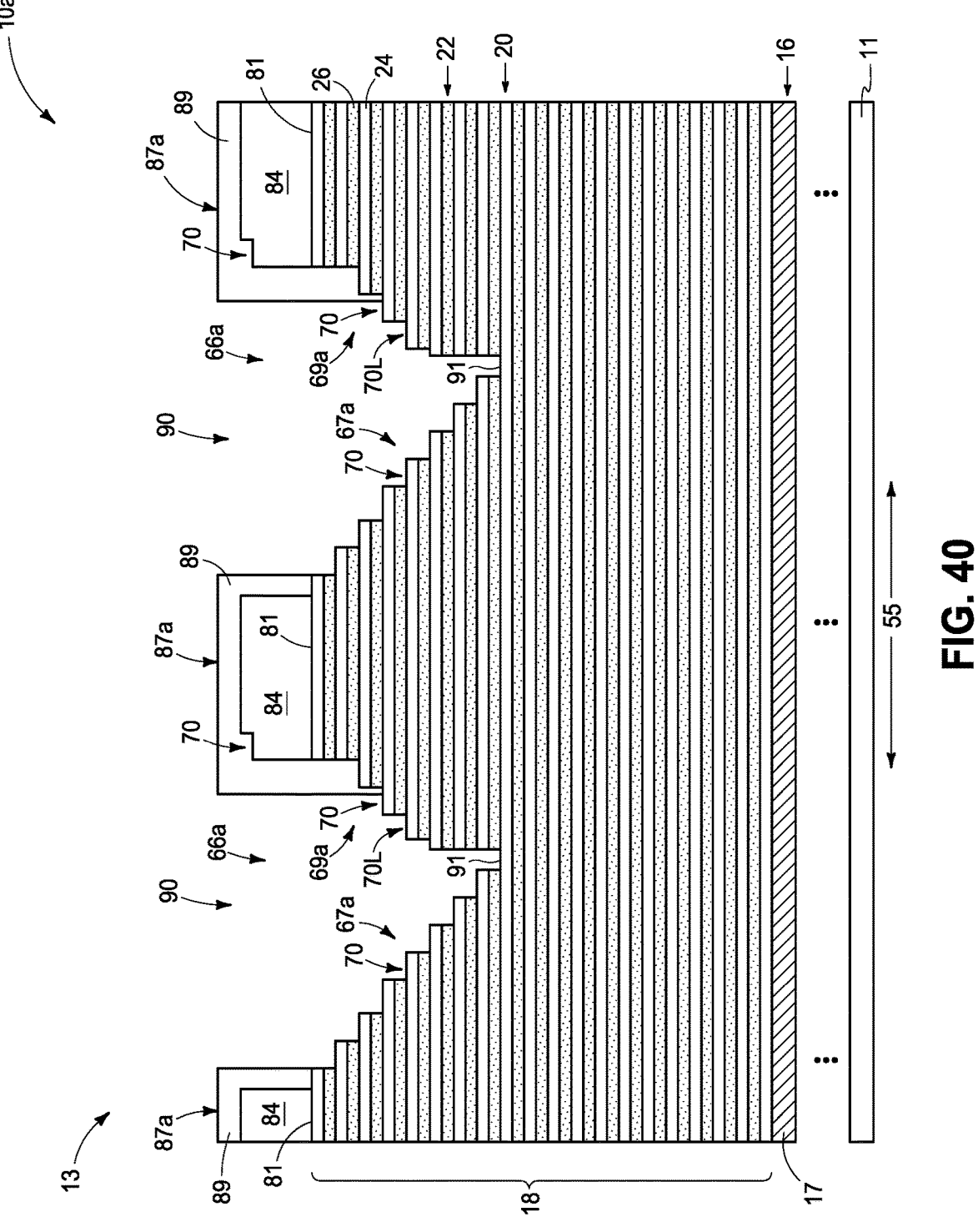
Figure 41:
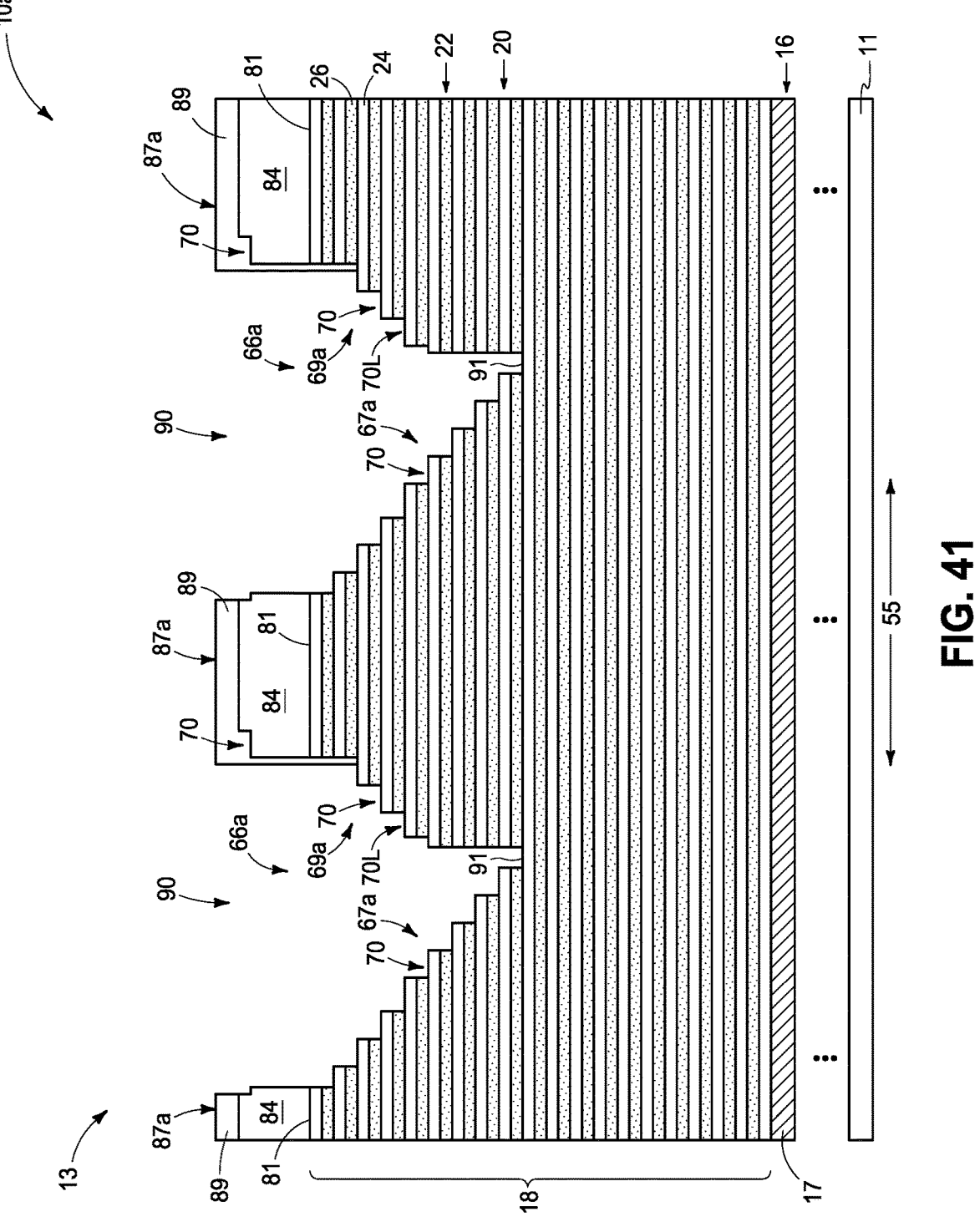
Figure 42:
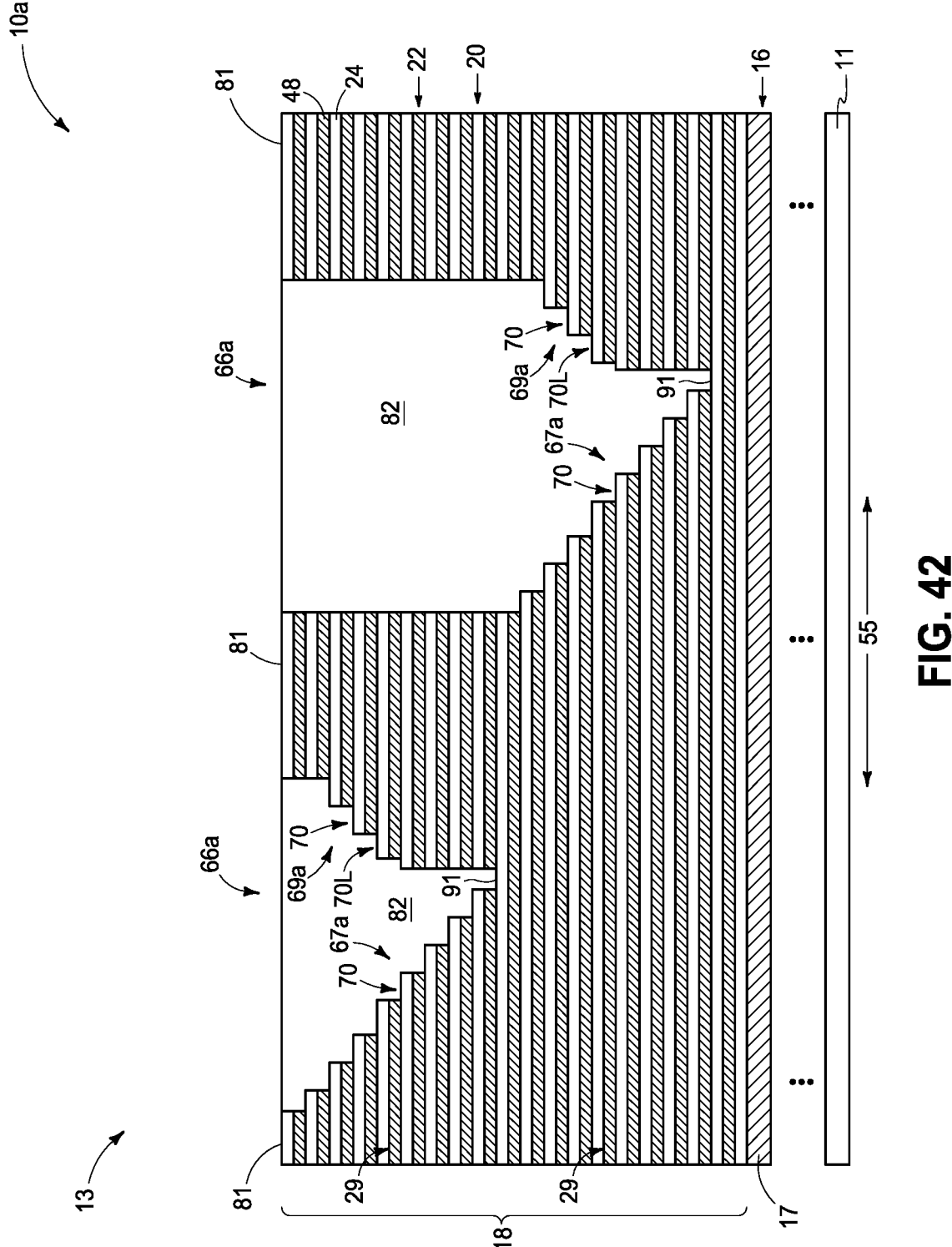
Figure 43:
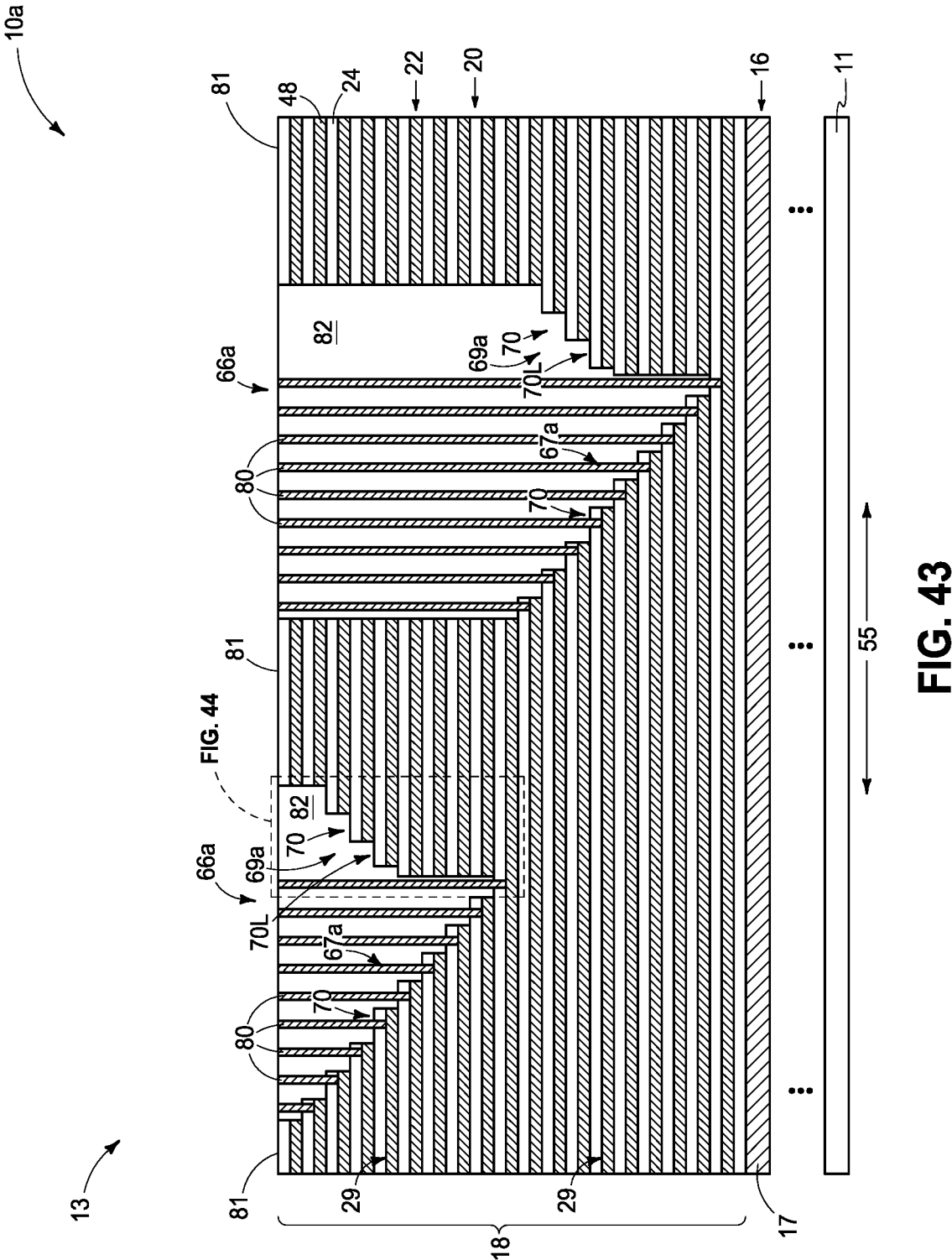
Figure 44:
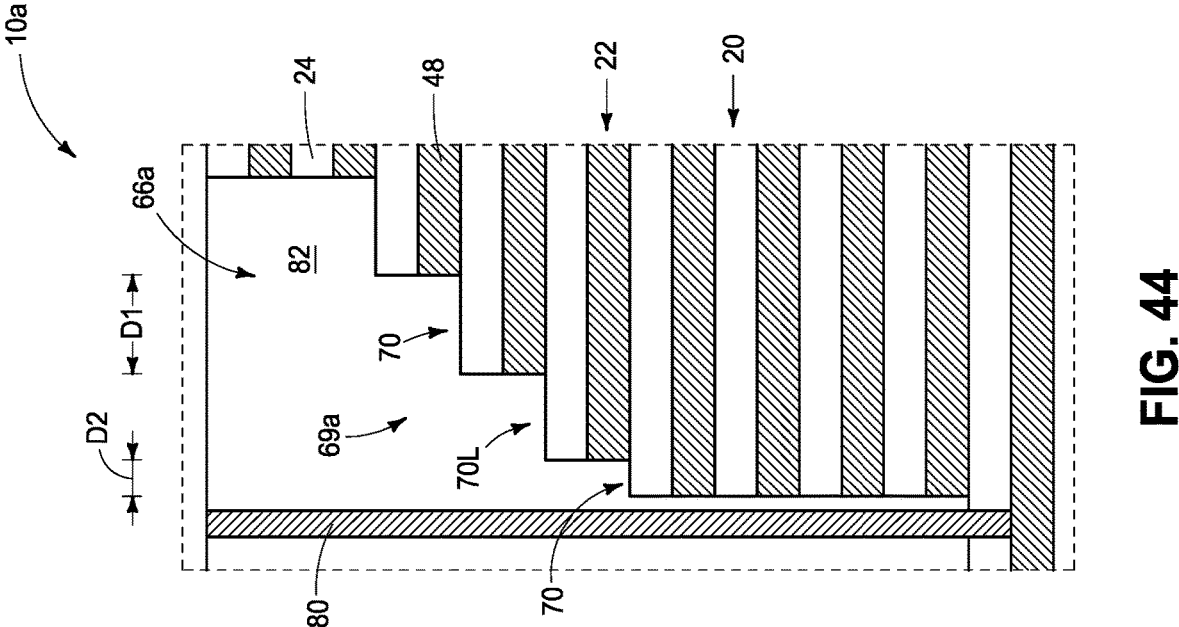
Figure 45:
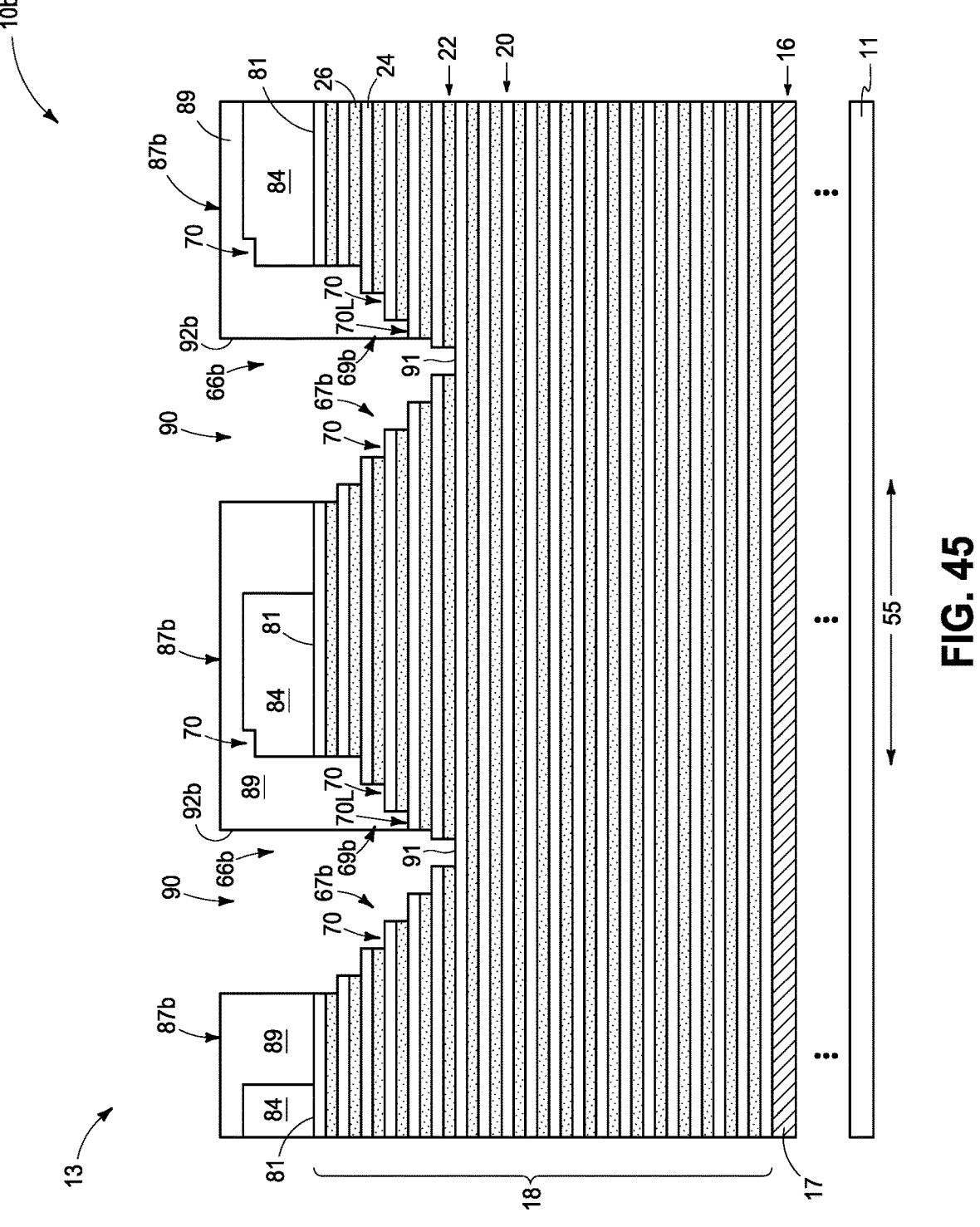
Figure 46:
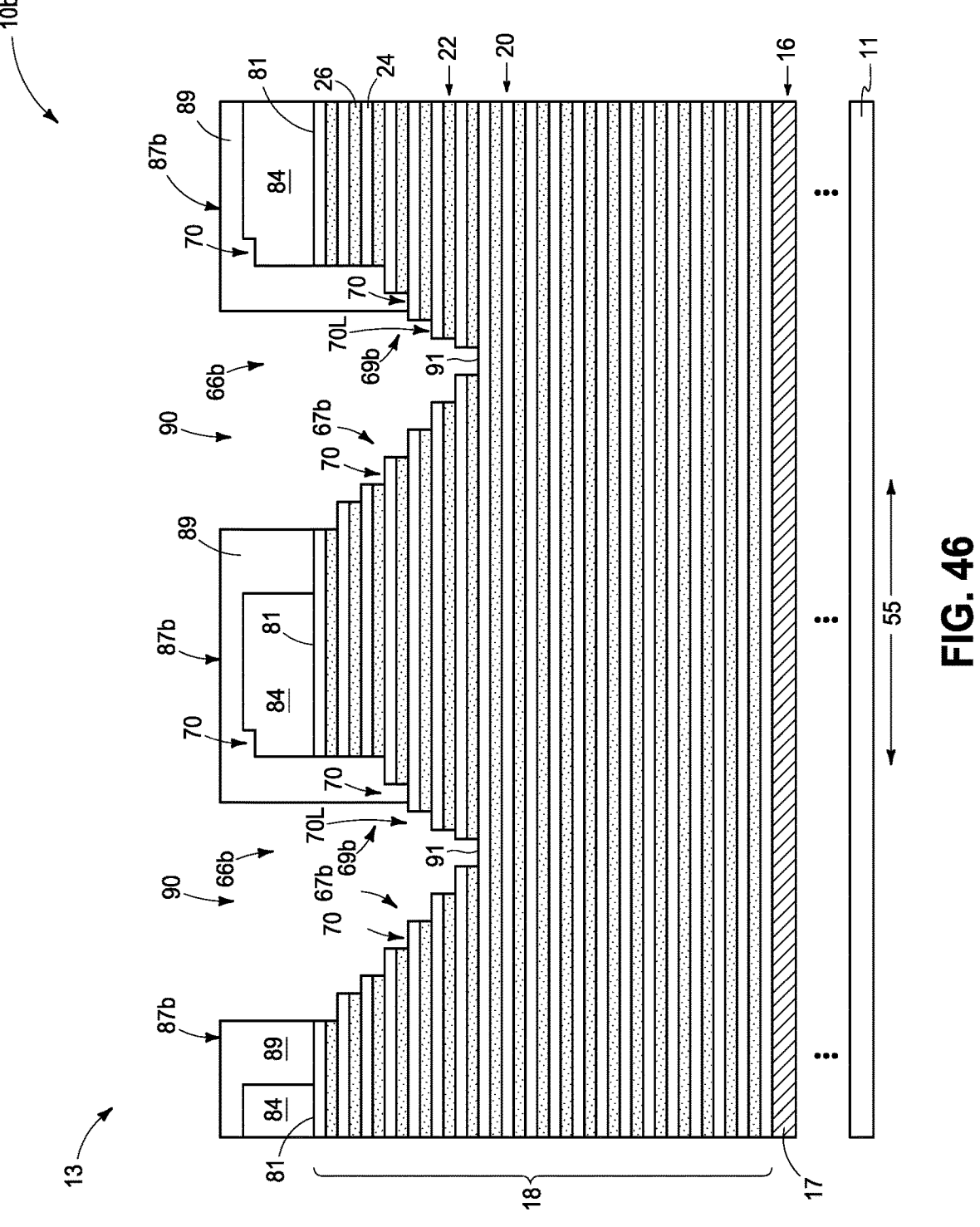
Figure 47:
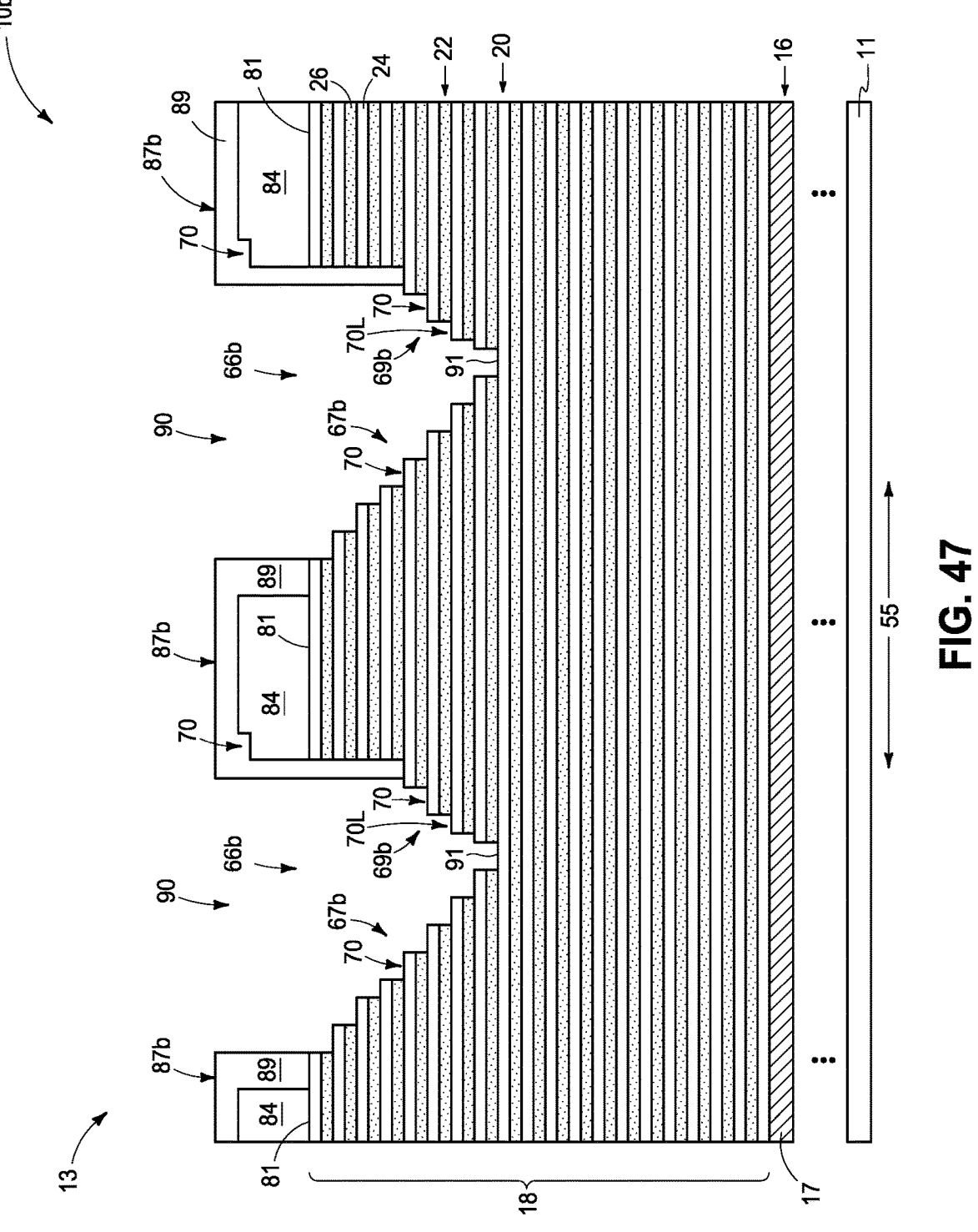
Figure 48:
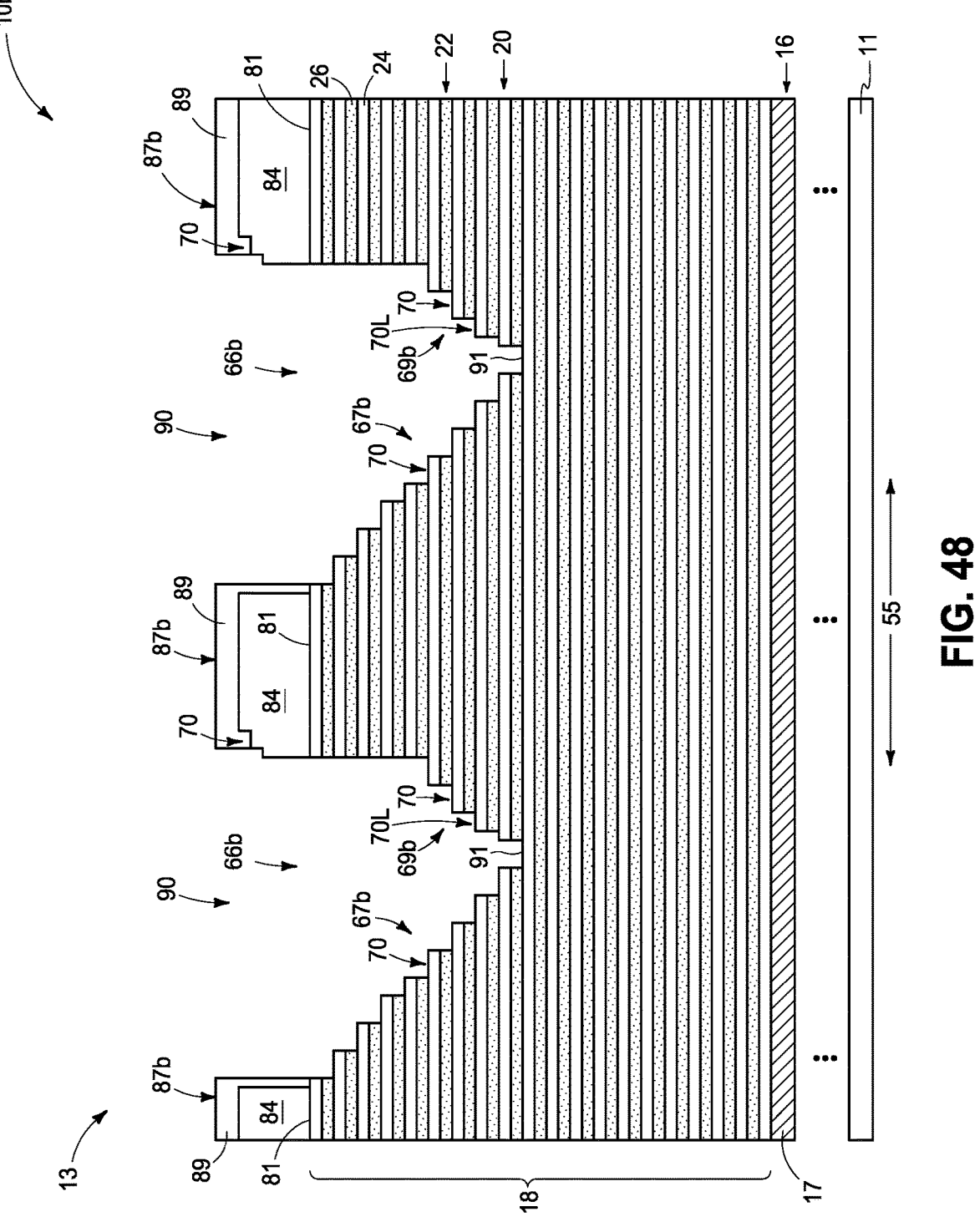
Figure 49:
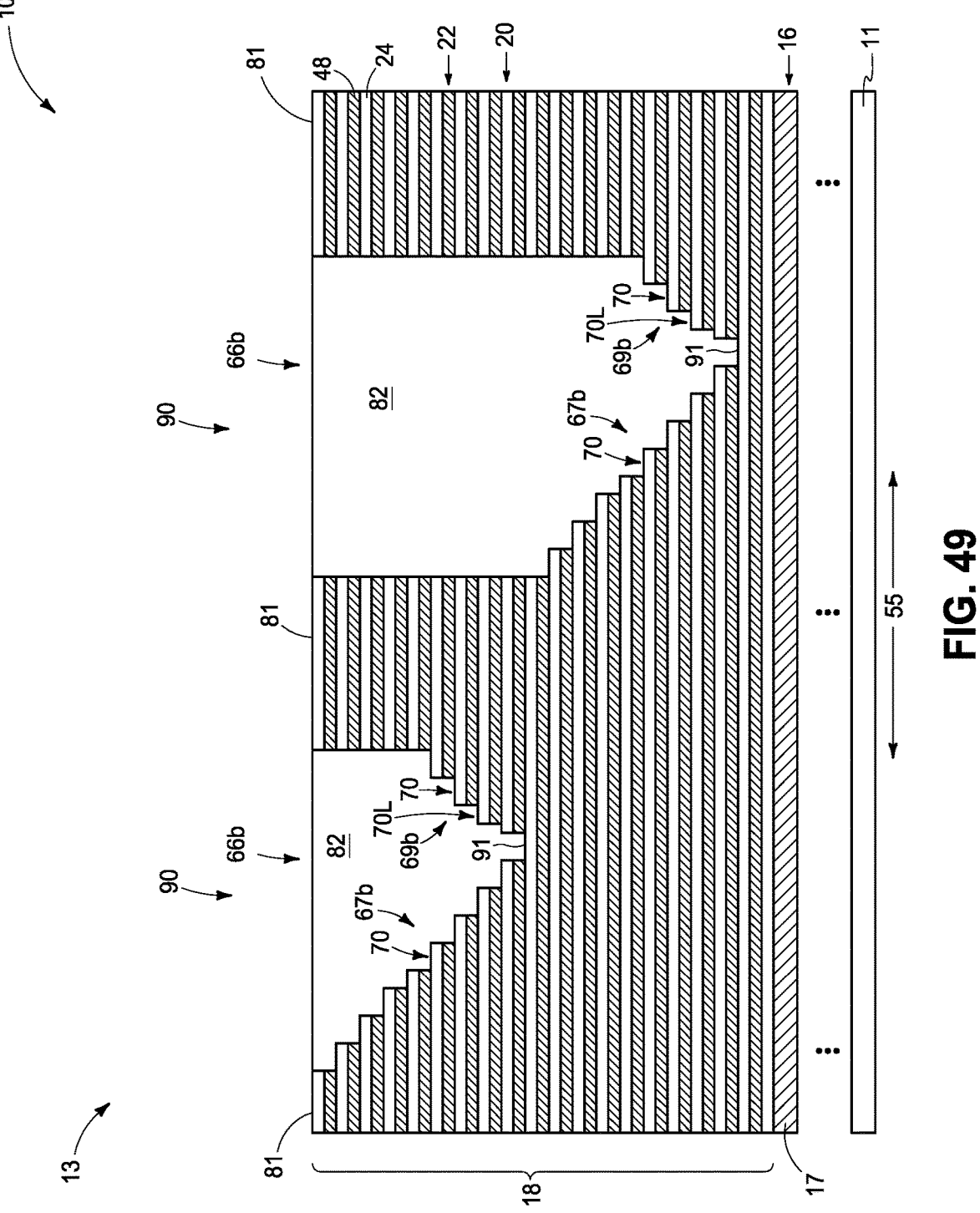
Figure 50:
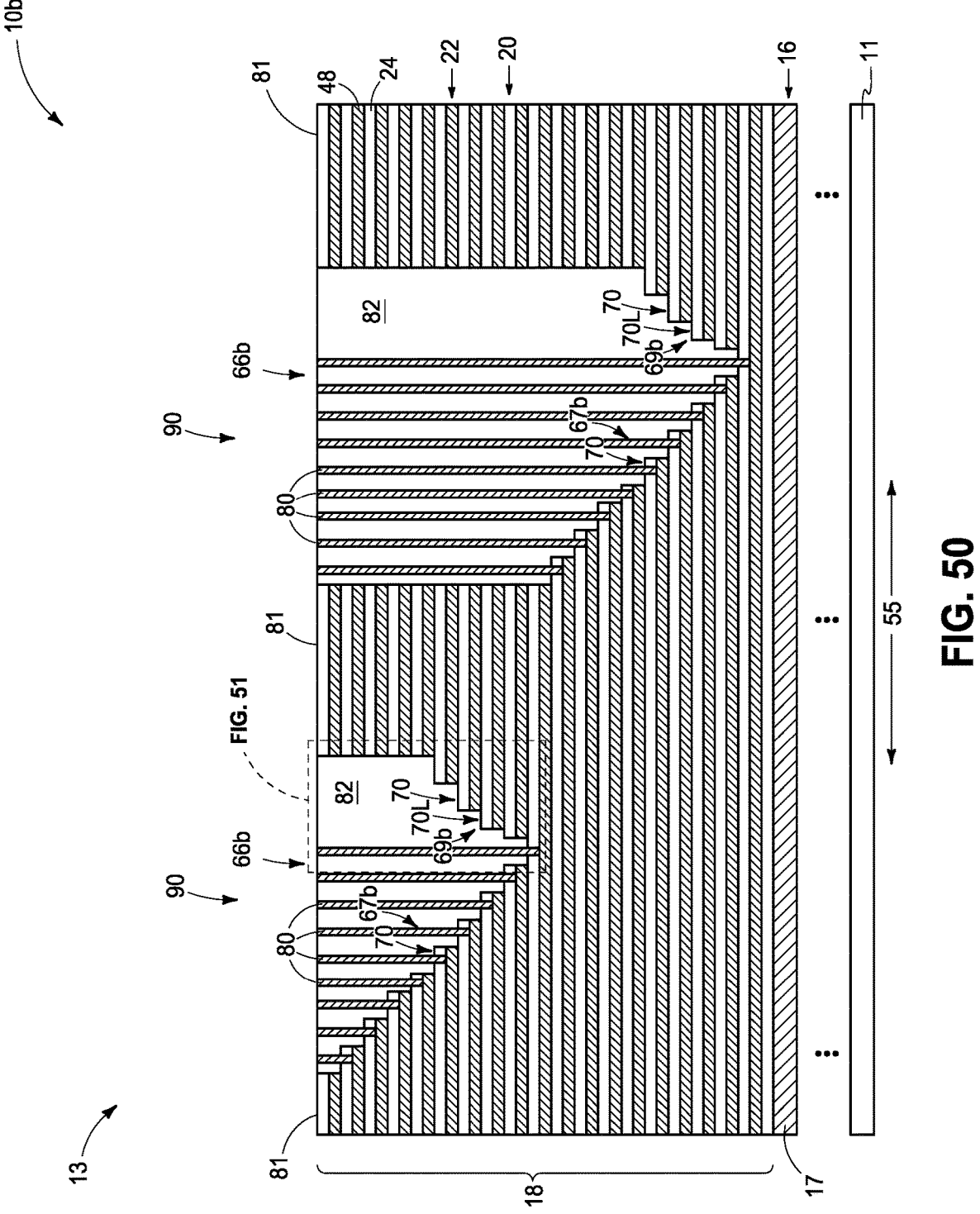
Figure 51:
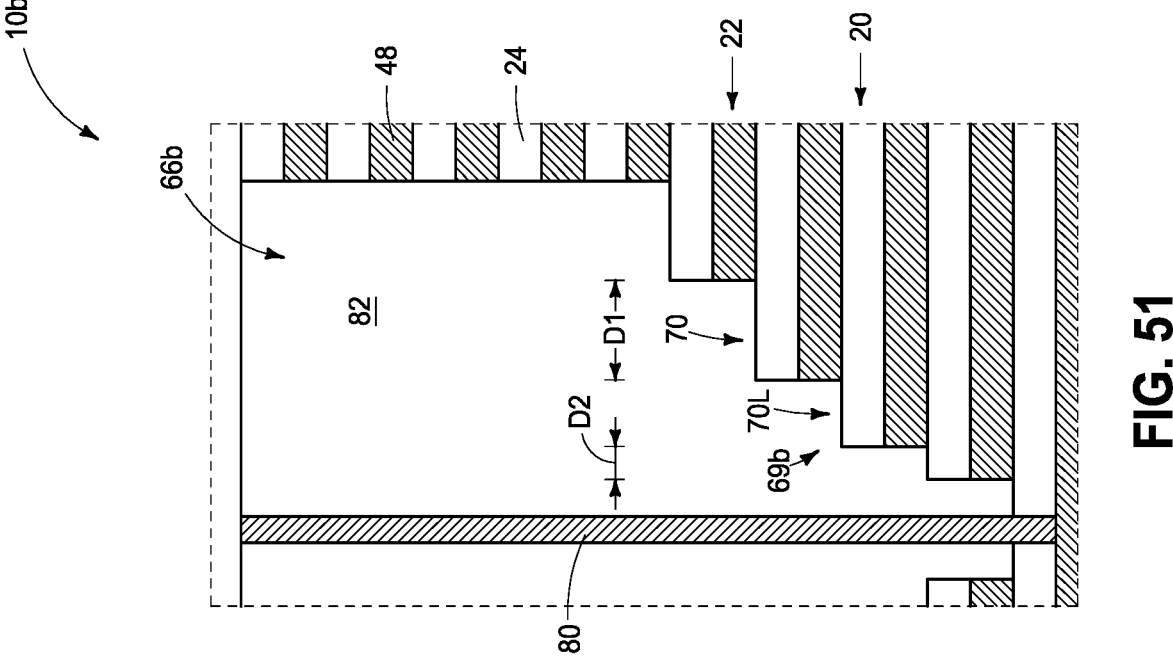

Referring to FIGS. 35-37, conductive vias 80 have been formed through insulative material 82, with individual conductive vias 80 being directly above and directly against conducting material 48 of individual stairs 70*. An insulative lining (e.g., silicon nitride and not shown) may be circumferentially around individual conductive vias 80.

In one embodiment, a method used in forming memory circuitry (e.g., 12) comprises forming a stack (e.g., 18) comprising vertically-alternating first tiers (e.g., 22) and second tiers (e.g., 20). The stack extends from a memory-array region (e.g., 12) into a stair-step region (e.g., 13) along a first direction (e.g., 55). The first tiers are conductive and the second tiers are insulative at least in a finished-circuitry construction. A plurality of stair-step structures (e.g., 66) is formed in the stair-step region. The stair-step structures are spaced relative one another in a vertical cross-section (e.g., that of FIG. 35 and as shown in the horizontal view of FIG.

26) along the first direction. The stair-step structures individually comprise two opposing flights (e.g., 67\* and 69\*) of stairs (e.g., 70\*) in the vertical cross-section. The two opposing flights have a landing there-between (e.g., 91 in FIGS. 35 and 37). Pitch (e.g., P) of the stair-step structures in the vertical cross-section is less than a sum of horizontal-length of the landing (e.g., L1 in FIG. 37) in the vertical cross-section plus two times horizontal-length (e.g., L2 in FIG. 37) of a horizontally-longest of the two opposing flights in the vertical cross-section (e.g., flight 67 in FIG. 37; e.g., flight 69 having a horizontal-length L3 that is shorter than L2). Channel-material strings (e.g., 53) of memory cells (e.g., 56) are formed and that extend through the first tiers and the second tiers in the memory-array region.

In one embodiment, the pitch is no greater than a sum of the horizontal-length of the landing in the vertical cross-section plus 1.5 times horizontal-length of the horizontally-longest of the two opposing flights in the vertical cross-section. In one embodiment, one of the two opposing flights in individual of the stair-step structures is operative (e.g., 67\*) and the other of the two opposing flights in the individual stair-step structures is dummy (e.g., 69\*) in the finished-circuitry construction. In one such embodiment, the other of the two opposing flights in the individual stair-step structures has less stairs than the one of the two opposing flights in the individual stair-step structures in the finished-circuitry construction.

Heretofore, best pitch P as described above is understood to have been no less than a sum of horizontal-length of the landing in the vertical cross-section plus two times horizontal-length of the horizontally-longest of the two opposing flights in the vertical cross-section. Using two mask-patterning steps as described above (e.g., as shown by FIGS. 7 and 11) enables P to be less than a sum of horizontal-length of the landing plus two times horizontal-length of the horizontally-longest of the two opposing flights, specifically approaching or at 1.5 times horizontal-length of the horizontally-longest of the two opposing flights, thus enabling although not requiring an increase in circuit density. In accordance with some embodiments of the invention, more than two mask-patterning steps may be used with more than two layers of imageable resist and may result in further reduced pitch. For example, three, four, and five masking steps may result in said sum approaching or being at horizontal-length of the landing plus 1.33, 1.25, and 1.2, respectively, times the horizontal-length of the horizontally-longest of the two opposing flights.

Any other attribute(s) or aspect(s) as shown and/or described herein with respect to other embodiments may be used in the embodiments shown and described with reference to the above embodiments.

FIGS. 26-37 show an example final-construction result occurring from perfect lateral mask alignment with respect to lowest stair 70L in producing the construction of FIG. 11. FIGS. 38-44 show example processing for construction 10_a_ from FIG. 16 corresponding to that through FIG. 35 for construction 10. FIGS. 45-51 show example processing for construction 10_b_ from FIG. 17 corresponding to that through FIG. 35 for construction 10. More stairs 70\* may result, for example as shown. Any other attribute(s) or aspect(s) as shown and/or described herein with respect to other embodiments may be used.

In one embodiment, a method used in forming memory circuitry (e.g., 10\*) comprises forming a stack (e.g., 18) comprising vertically-alternating first tiers (e.g., 22) and second tiers (e.g., 20). The stack extends from a memory-array region (e.g., 12) into a stair-step region (e.g., 13) along a first direction (e.g., 55). The first tiers are conductive and the second tiers are insulative at least in a finished-circuitry construction. A stair-step structure (e.g., 66_a_, 66_b_) is formed in the stair-step region. The stair-step structure comprises two opposing flights (e.g., 67_a_ and 69_a_; 67_b_ and 69_b_) of stairs (e.g., 70\*) in a vertical cross-section (e.g., that of FIGS. 43 and 50) along the first direction. The collective stairs in one (at least one) of the flights (e.g., 69_a_, 69_b_) have at least two different horizontal depths (e.g., D1 and D2 in FIGS. 44 and 51). The shortest of the horizontal depths (e.g., D2) is no more than 50% of the longest of the horizontal depths (e.g., D1).

The shortest of the horizontal depths may be no less than 5% of the longest of the horizontal depths and/or may be no more than 25% of the longest of the horizontal depths. As further examples, the shortest of the horizontal depths may be 5% to 20% of the longest of the horizontal depths, 5% to 15% of the longest of the horizontal depths, 5% to 10% of the longest of the horizontal depths, and 5% to 10% of the longest of the horizontal depths. Regardless, in one embodiment the one flight is dummy.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, memory circuitry (e.g., 10\*) comprising strings (e.g., 49) of memory cells (e.g., 56) comprises channel-material strings (e.g., 53) of memory cells extending through insulative tiers (e.g., 20) and conductive tiers (e.g., 22) in a memory-array region (e.g., 12). The insulative and conductive tiers extend from the memory-array region into a stair-step region (e.g., 13) along a first direction (e.g., 55). A plurality of stair-step structures (e.g., 66) are in the stair-step region. The stair-step structures are spaced relative one another in a vertical cross-section (e.g., that of FIG. 35 and as shown in the horizontal view of FIG. 26) along the first direction. The stair-step structures individually comprise two opposing flights (e.g., 67\* and 69\*) of stairs (e.g., 70\*) in the vertical cross-section. The two opposing flights have a landing (e.g., 91) there-between. Pitch (e.g., P) of the stair-step structures in the vertical cross-section is less than a sum of horizontal-length of the landing (e.g., L1) in the vertical cross-section plus two times horizontal-length of a horizontally-longest of the two opposing flights (e.g., L2) in the vertical cross-section. Any other attribute(s) or aspect(s) as shown and/or described herein with respect to other embodiments may be used.

In one embodiment, memory circuitry (e.g., 10\*) comprising strings (e.g., 49) of memory cells (e.g., 56) comprises a stack (e.g., 18) comprising vertically-alternating insulative tiers (e.g., 20) and conductive tiers (e.g., 22). Channel-material strings (e.g., 53) of memory cells extend through the insulative tiers and the conductive tiers in a memory-array region (e.g., 12). The insulative tiers and the conductive tiers extend from the memory-array region into a stair-step region (e.g., 13). The stair-step region comprises a stair-step structure (e.g., 66) comprising two opposing flights of stairs (e.g., 67\*, 69\*) in a vertical cross-section (e.g., that of FIGS. 43 and 50) along a first direction (e.g., 55). The collective stairs in one of the flights (e.g., 69*a*, 69*b*) have at least two different horizontal depths (e.g., D1 and D2 in FIGS. 44 and 51). The shortest of the horizontal depths (e.g., D2) is no more than 50% of the longest of the horizontal depths (e.g., D1). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry comprises forming a stack comprising vertically-alternating first tiers and second tiers. The stack extends from a memory-array region into a stair-step region. The first tiers are conductive and the second tiers are insulative at least in a finished-circuitry construction. A first layer of imageable resist is exposed to actinic radiation and developed to form a first opening there-through in the stair-step region. The developed first layer is used in a plurality of alternating etching and lateral-trimming steps that widens the first opening and forms two opposing flights of stairs in the stack in the stair-step region. A second layer of imageable resist is formed directly above the two opposing flights of stairs. The second layer is exposed to actinic radiation and developed to form a second opening there-through. The second opening exposes all of the stairs of one of the two opposing flights. The second layer is directly above all of the stairs in the other of the two opposing flights. The developed second layer is used in a plurality of alternating etching and lateral-trimming steps that widens the second opening, lengthens at least one of the two opposing flights of stairs, and extends the two opposing flights of stairs deeper into the stack.

In some embodiments, a method used in forming memory circuitry comprises forming a stack comprising vertically-alternating first tiers and second tiers. The stack extends from a memory-array region into a stair-step region along a first direction. The first tiers are conductive and the second tiers are insulative at least in a finished-circuitry construction. A plurality of stair-step structures is formed in the stair-step region. The stair-step structures are spaced relative one another in a vertical cross-section along the first direction. The stair-step structures individually comprise two opposing flights of stairs in the vertical cross-section. The two opposing flights have a landing there-between. Pitch of the stair-step structures in the vertical cross-section is less than a sum of horizontal-length of the landing in the vertical cross-section plus two times horizontal-length of a horizontally-longest of the two opposing flights in the vertical cross-section. Channel-material strings of memory cells are formed that extend through the first tiers and the second tiers in the memory-array region.

In some embodiments, a method used in forming memory circuitry comprises forming a stack comprising vertically-alternating first tiers and second tiers. The stack extends from a memory-array region into a stair-step region along a first direction. The first tiers are conductive and the second tiers are insulative at least in a finished-circuitry construction. A stair-step structure is formed in the stair-step region. The stair-step structure comprises two opposing flights of stairs in a vertical cross-section along the first direction. The collective stairs in one of the flights has at least two different horizontal depths. The shortest of the horizontal depths is no more than 50% of the longest of the horizontal depths.

In some embodiments, memory circuitry comprising strings of memory cells comprises channel-material strings of memory cells extending through insulative tiers and conductive tiers in a memory-array region. The insulative and conductive tiers extend from the memory-array region into a stair-step region along a first direction. A plurality of stair-step structures is in the stair-step region. The stair-step structures are spaced relative one another in a vertical cross-section along the first direction. The stair-step structures individually comprise two opposing flights of stairs in the vertical cross-section. The two opposing flights have a landing there-between. Pitch of the stair-step structures in the vertical cross-section is less than a sum of horizontal-length of the landing in the vertical cross-section plus two times horizontal-length of a horizontally-longest of the two opposing flights in the vertical cross-section.

In some embodiments, memory circuitry comprising strings of memory cells comprises a stack comprising vertically-alternating insulative tiers and conductive tiers. Channel-material strings of memory cells extend through the insulative tiers and the conductive tiers in a memory-array region. The insulative tiers and the conductive tiers extend from the memory-array region into a stair-step region. The stair-step region comprises a stair-step structure comprising two opposing flights of stairs in a vertical cross-section along a first direction. The collective stairs in one of the flights have at least two different horizontal depths. The shortest of the horizontal depths is no more than 50% of the longest of the horizontal depths.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:

forming a stack comprising vertically-alternating first tiers and second tiers, the stack extending from a memory-array region into a stair-step region, the first tiers being conductive and the second tiers being insulative at least in a finished-circuitry construction;

exposing a first layer of imageable resist to actinic radiation and developing the exposed first layer to form a first opening there-through in the stair-step region;

using the developed first layer in a plurality of alternating etching and lateral-trimming steps that widens the first opening and forms two opposing flights of stairs in the stack in the stair-step region;

forming a second layer of imageable resist directly above the two opposing flights of stairs;

exposing the second layer to actinic radiation and developing the exposed second layer to form a second opening there-through, the second opening exposing all of the stairs of one of the two opposing flights, the second layer being directly above all of the stairs in the other of the two opposing flights; and using the developed second layer in a plurality of alternating etching and lateral-trimming steps that widens the second opening, lengthens at least one of the two opposing flights of stairs, and extends the two opposing flights of stairs deeper into the stack; and comprising providing non-imageable hard-masking material vertically between the stack and the first and second layers, the non-imageable hard-masking material comprising laterally-spaced patterned features in the stair-step region, the first opening in the first layer of imageable resist having sidewalls that are laterally between and laterally spaced from the patterned features prior to said using of the developed first layer.

2. The method of claim 1 comprising forming one or more stairs in the non-imageable hard-masking material.

3. A method used in forming memory circuitry, comprising:

forming a stack comprising vertically-alternating first tiers and second tiers, the stack extending from a memory-array region into a stair-step region, the first tiers being conductive and the second tiers being insulative at least in a finished-circuitry construction;

exposing a first layer of imageable resist to actinic radiation and developing the exposed first layer to form a first opening there-through in the stair-step region;

using the developed first layer in a plurality of alternating etching and lateral-trimming steps that widens the first opening and forms two opposing flights of stairs in the stack in the stair-step region;

forming a second layer of imageable resist directly above the two opposing flights of stairs;

exposing the second layer to actinic radiation and developing the exposed second layer to form a second opening there-through, the second opening exposing all of the stairs of one of the two opposing flights, the second layer being directly above all of the stairs in the other of the two opposing flights; and using the developed second layer in a plurality of alternating etching and lateral-trimming steps that widens the second opening, lengthens at least one of the two opposing flights of stairs, and extends the two opposing flights of stairs deeper into the stack; and forming one or more stairs in the non-imageable hard-masking material, the one or more stairs in the non-imageable hard-masking material is/are more proximate the other of the two opposing flights in the stack than the one of the two opposing flights in the stack.

4. A method used in forming memory circuitry, comprising:

forming a stack comprising vertically-alternating first tiers and second tiers, the stack extending from a memory-array region into a stair-step region, the first tiers being conductive and the second tiers being insulative at least in a finished-circuitry construction;

exposing a first layer of imageable resist to actinic radiation and developing the exposed first layer to form a first opening there-through in the stair-step region;

using the developed first layer in a plurality of alternating etching and lateral-trimming steps that widens the first opening and forms two opposing flights of stairs in the stack in the stair-step region;

forming a second layer of imageable resist directly above the two opposing flights of stairs;

exposing the second layer to actinic radiation and developing the exposed second layer to form a second opening there-through, the second opening exposing all of the stairs of one of the two opposing flights, the second layer being directly above all of the stairs in the other of the two opposing flights; and using the developed second layer in a plurality of alternating etching and lateral-trimming steps that widens the second opening, lengthens at least one of the two opposing flights of stairs, and extends the two opposing flights of stairs deeper into the stack; and the second layer covering some but less-than-all of an uppermost surface of a lowest of the stairs in the other of the two opposing flights immediately-prior to the starting the alternating etching and lateral-trimming steps that widens the second opening, lengthens at least one of the two opposing flights of stairs, and extends the two opposing flights of stairs deeper in the stack.

5. A method used in forming memory circuitry, comprising:

forming a stack comprising vertically-alternating first tiers and second tiers, the stack extending from a memory-array region into a stair-step region along a first direction, the first tiers being conductive and the second tiers being insulative at least in a finished-circuitry construction; and forming a stair-step structure in the stair-step region, the stair-step structure comprising two opposing flights of stairs in a vertical cross-section along the first direction, the collective stairs in one of the flights having at least two different horizontal depths along the first direction, the shortest of the horizontal depths being no more than 25% of the longest of the horizontal depths.

6. The method of claim 5 wherein the shortest of the horizontal depths is no less than 5% of the longest of the horizontal depths.

7. A method used in forming memory circuitry, comprising:

forming a stack comprising vertically-alternating first tiers and second tiers, the stack extending from a memory-array region into a stair-step region along a first direction, the first tiers being conductive and the second tiers being insulative at least in a finished-circuitry construction; and forming a stair-step structure in the stair-step region, the stair-step structure comprising two opposing flights of stairs in a vertical cross-section along the first direction, the collective stairs in one of the flights having at least two different horizontal depths along the first direction, the shortest of the horizontal depths being 5% to 20% of the longest of the horizontal depths.

8. The method of claim 7 wherein the shortest of the horizontal depths is 5% to 15% of the longest of the horizontal depths.

9. The method of claim 8 wherein the shortest of the horizontal depths is 5% to 10% of the longest of the horizontal depths.

\*　\*　\*　\*　\*